United States Patent
Kim et al.

(10) Patent No.: US 11,985,879 B2
(45) Date of Patent: May 14, 2024

(54) DISPLAY PANEL HAVING AN ARRANGEMENT BY UNIT PIXEL PAIRS

(71) Applicant: SAMSUNG DISPLAY CO., LTD., Yongin-si (KR)

(72) Inventors: Sunghwan Kim, Yongin-si (KR); Chulkyu Kang, Yongin-si (KR); Soohee Oh, Yongin-si (KR); Dongsun Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/312,937

(22) Filed: May 5, 2023

(65) Prior Publication Data

US 2023/0276677 A1 Aug. 31, 2023

Related U.S. Application Data

(62) Division of application No. 16/943,297, filed on Jul. 30, 2020, now Pat. No. 11,665,947.

(30) Foreign Application Priority Data

Jul. 31, 2019 (KR) .................... 10-2019-0093368

(51) Int. Cl.
*H10K 59/35* (2023.01)
*H10K 59/12* (2023.01)
*H10K 59/122* (2023.01)
*H10K 59/13* (2023.01)
*H10K 59/131* (2023.01)

(52) U.S. Cl.
CPC ......... *H10K 59/353* (2023.02); *H10K 59/122* (2023.02); *H10K 59/131* (2023.02)

(58) Field of Classification Search
CPC ... H10K 59/353; H10K 59/122; H10K 59/131
USPC ....................................... 257/40; 438/82, 99
See application file for complete search history.

(56) References Cited

U.S. PATENT DOCUMENTS

| 8,764,913 B2 | 6/2014 | Hwan |
| 9,013,098 B1 | 4/2015 | Kim et al. |
| 9,728,588 B2 | 8/2017 | Peng et al. |

(Continued)

FOREIGN PATENT DOCUMENTS

| KR | 10-1255712 | 4/2013 |
| KR | 10-2015-0107883 | 9/2015 |

(Continued)

*Primary Examiner* — Didarul A Mazumder
(74) *Attorney, Agent, or Firm* — F. CHAU & ASSOCIATES, LLC

(57) ABSTRACT

A display panel includes a first unit pixel including a first pixel electrode for emitting red light, a first pixel electrode for emitting blue light, and a first pixel electrode for emitting green light. A second unit pixel neighbors the first unit pixel and includes a second pixel electrode for emitting red light, a second pixel electrode for emitting blue light, and a second pixel electrode for emitting green light. The first unit pixel further includes a first red emission layer disposed on the first pixel electrode for emitting red light. The second unit pixel further includes a second red emission layer disposed on the second pixel electrode for emitting red light. The first red emission layer is spaced apart from the second red emission layer in the first direction.

3 Claims, 18 Drawing Sheets

(56) References Cited

U.S. PATENT DOCUMENTS

| | | | | |
|---|---|---|---|---|
| 2009/0121983 | A1* | 5/2009 | Sung | H10K 59/352 |
| | | | | 345/76 |
| 2011/0128262 | A1* | 6/2011 | Chaji | H10K 50/856 |
| | | | | 313/504 |
| 2012/0056531 | A1* | 3/2012 | Park | H10K 50/125 |
| | | | | 313/506 |
| 2013/0201169 | A1* | 8/2013 | Ahn | G09G 3/3241 |
| | | | | 345/76 |
| 2015/0364526 | A1 | 12/2015 | Peng et al. | |
| 2016/0155416 | A1 | 6/2016 | Lee | |
| 2016/0322436 | A1* | 11/2016 | Jung | H10K 59/1213 |
| 2016/0329385 | A1 | 11/2016 | Qiu et al. | |
| 2016/0357076 | A1 | 12/2016 | Huangfu et al. | |
| 2017/0309688 | A1 | 10/2017 | Lee et al. | |
| 2018/0247984 | A1* | 8/2018 | Wang | H10K 59/352 |
| 2019/0173042 | A1 | 6/2019 | Lim | |
| 2021/0038067 | A1 | 2/2021 | Kim et al. | |

FOREIGN PATENT DOCUMENTS

| | | |
|---|---|---|
| KR | 10-2015-0055264 | 5/2016 |
| KR | 10-2017-0120488 | 10/2017 |
| KR | 10-1865215 | 6/2018 |

* cited by examiner

DISPLAY PANEL HAVING AN ARRANGEMENT BY UNIT PIXEL PAIRS

CROSS-REFERENCE TO RELATED APPLICATION

This application is a Division of co-pending U.S. patent application Ser. No. 16/943,297, filed on Jul. 30, 2020, which claims priority under 35 U.S.C. 119 to Korean Patent Application No. 10-2019-0093368, filed on Jul. 31, 2019 in the Korean Intellectual Property Office, the disclosures of which are incorporated by reference herein in their entirety.

TECHNICAL FIELD

The present disclosure relates to a display panel, and more particularly, to a display panel that has an arrangement of pixels that organized by unit pixel pairs.

DISCUSSION OF THE RELATED ART

Recently, display devices have become more diversified for use in a wide variety of different products. Various components for performing features other than displaying an image have been added to display panels of a display device, and display devices have been miniaturized for use in mobile phones and have been made larger for use in large-scale display devices such as televisions.

Of the various different types of display devices, the organic light-emitting diode (OLED) display device is noted for having a wide viewing angle and excellent contrast, as well as fast response speeds. OLED display devices have been widely used in smartphones, smart watches, and even televisions. Generally, an organic light-emitting diode display device includes a thin film transistor and display elements such as an organic light-emitting diode, and the display elements operate by emitting light in response to an electric signal.

The display elements of a display panel are formed by sequentially stacking various material layers through a patterning process that uses a mask, photolithography, etc.

SUMMARY

One or more embodiments include a display panel in which a process for manufacturing organic light-emitting diodes of a display panel is easy to perform and which has an increased emission uniformity of a display area. However, it should be understood that embodiments described herein should be considered in a descriptive sense and that variations of the described embodiments may be considered as included within the inventive concept.

According to one or more exemplary embodiments of the present disclosure, a display panel includes a first unit pixel arranged over a substrate and including a first pixel electrode for emitting red light, a first pixel electrode for emitting blue light, and a first pixel electrode for emitting green light. A second unit pixel neighbors the first unit pixel in a first direction and includes a second pixel electrode for emitting red light, a second pixel electrode for emitting blue light, and a second pixel electrode for emitting green light. The first unit pixel further includes a first red emission layer disposed on the first pixel electrode for emitting red light. The second unit pixel further includes a second red emission layer disposed on the second pixel electrode for emitting red light. The first red emission layer is spaced apart from the second red emission layer in the first direction. The first unit pixel and the second unit pixel further include a blue emission layer disposed on the first pixel electrode for emitting blue light and the second pixel electrode for emitting blue light. A first portion of the blue emission layer corresponds to the first pixel electrode for emitting blue light. A second portion of the blue emission layer corresponds to the second pixel electrode for emitting blue light.

The first pixel electrode for emitting red light may be spaced apart from the first pixel electrode for emitting green light in the first direction. The first pixel electrode for emitting blue light may be spaced apart from the first pixel electrode for emitting red light or the first pixel electrode for emitting green light in a second direction intersecting with the first direction.

The display panel may further include a planarization insulating layer arranged over the substrate and including a first contact hole, a second contact hole, and a third contact hole spaced apart from one another in the first direction. A first pixel circuit emits red light and is electrically connected to the first pixel electrode for emitting red light through the first contact hole. A first pixel circuit emits blue light and is electrically connected to the first pixel electrode for emitting blue light through the second contact hole. A first pixel circuit emits green light and is electrically connected to the first pixel electrode for emitting green light through the third contact hole.

The first pixel electrode for emitting red light may include a first electrode portion and a first connection portion extending from one side of the first electrode portion and overlapping the first contact hole. The first pixel electrode for emitting blue light may include a second electrode portion and a second connection portion extending from one side of the second electrode portion and overlapping the second contact hole. The first pixel electrode for emitting green light may include a third electrode portion and a third connection portion extending from one side of the third electrode portion and overlapping the third contact hole. The first connection portion and the third connection portion may extend toward the first pixel electrode for emitting blue light.

The second connection portion may be located in a region between the first connection portion and the third connection portion.

The planarization insulating layer may further include a fourth contact hole spaced apart in the first direction from the third contact hole. The second pixel electrode for emitting blue light may include a fourth electrode portion and a fourth connection portion extending from one side of the fourth electrode portion and overlapping the fourth contact hole. A length of the second connection portion in the second direction may be substantially the same as a length of the fourth connection portion.

The display panel may further include a pixel-defining layer including a first opening exposing a central portion of the first electrode portion, a second opening exposing a central portion of the second electrode portion, and a third opening exposing a central portion of the third electrode portion. The pixel-defining layer may at least partially cover each of the first connection portion, the second connection portion, and the third connection portion.

At least a portion of the blue emission layer may be arranged on a portion of the pixel-defining layer between the first pixel electrode for emitting blue light and the second pixel electrode for emitting blue light.

The display panel may further include a third unit pixel neighboring the second unit pixel in the first direction and including a third pixel electrode for emitting red light, a third pixel electrode for emitting green light, and a third pixel electrode for emitting blue light. A distance between the first pixel electrode for emitting blue light and the second pixel electrode for emitting blue light in the first direction may be less than a distance between the second pixel electrode for emitting blue light and the third pixel electrode for emitting blue light.

The display panel may further include a pixel-defining layer including a fourth opening that defines an emission area of the second pixel electrode for emitting blue light and a fifth opening that defines an emission area of the third pixel electrode for emitting blue light. A spacer is arranged on a portion of the pixel-defining layer between the second pixel electrode for emitting blue light and the third pixel electrode for emitting blue light.

The blue emission layer may be provided as a singular body on the first pixel electrode for emitting blue light and the second pixel electrode for emitting blue light.

The first unit pixel may further include a first green emission layer disposed on the first pixel electrode for emitting green light. The second unit pixel may further include a second green emission layer disposed on the second pixel electrode for emitting green light. The first green emission layer may be spaced apart from the second green emission layer in the first direction.

The display panel may further include a first data line, a second data line, and a third data line extending in the first direction and being spaced apart from each other. The first data line may supply a data signal to the first pixel electrode for emitting red light. The second data line may supply a data signal to the first pixel electrode for emitting blue light. The third data line may supply a data signal to the first pixel electrode for emitting green light.

The substrate may include a display area and a fan-out area. The display area includes the first unit pixel and the second unit pixel. The fan-out area includes the first data line, the second data line, and the third data line that extend around the display area. The first data line and the third data line may each be arranged on the same layer in the fan-out area. The second data line may be arranged on a layer different from the layer disposed on which the first data line and the third data line are arranged.

At least a portion of the second data line may overlap at least a portion of the third data line in the fan-out area.

According to one or more exemplary embodiments of the present disclosure, a display panel includes a substrate including a display area and a peripheral area that is outside of the display area. A plurality of pixel groups are arranged in the display area of the substrate. Each of the plurality of pixel groups is arranged in a 2×2-matrix and includes a first unit pixel arranged in a first quadrant, a second unit pixel arranged in a second quadrant, a third unit pixel arranged in a third quadrant, and a fourth unit pixel arranged in a fourth quadrant. The first unit pixel includes a first pixel electrode for emitting red light, a first pixel electrode for emitting blue light, and a first pixel electrode for emitting green light. The second unit pixel includes a second pixel electrode for emitting red light, a second pixel electrode for emitting blue light, and a second pixel electrode for emitting green light. The third unit pixel includes a third pixel electrode for emitting red light, a third pixel electrode for emitting blue light, and a third pixel electrode for emitting green light. The fourth unit pixel includes a fourth pixel electrode for emitting red light, a fourth pixel electrode for emitting blue light, and a fourth pixel electrode for emitting green light. A distance between the first pixel electrode for emitting red light and the second pixel electrode for emitting red light in a row direction is the same as a distance between the third pixel electrode for emitting red light and the fourth pixel electrode for emitting red light. A distance between the first pixel electrode for emitting blue light and the second pixel electrode for emitting blue light in the row direction is less than a distance between the third pixel electrode for emitting blue light and the fourth pixel electrode for emitting blue light.

A distance between the first pixel electrode for emitting green light and the second pixel electrode for emitting green light in the row direction may be substantially the same as a distance between the third pixel electrode for emitting green light and the fourth pixel electrode for emitting green light.

The display panel may further include a plurality of data lines including a first data line, a second data line, and a third data line, each extending in a column direction. The data lines of the plurality of data lines are spaced apart from one another, and are sequentially arranged in a row direction. The first data line may be electrically connected to the first pixel electrode for emitting red light and the third pixel electrode for emitting red light. The second data line may be electrically connected to the first pixel electrode for emitting blue light and the third pixel electrode for emitting blue light. The third data line may be electrically connected to the first pixel electrode for emitting green light and the third pixel electrode for emitting green light.

The first unit pixel and the second unit pixel may further include a first blue emission layer arranged over the first pixel electrode for emitting blue light and the second pixel electrode for emitting blue light. A first portion of the first blue emission layer may correspond to the first pixel electrode for emitting blue light, and a second portion of the first blue emission layer may correspond to the second pixel electrode for emitting blue light.

The first unit pixel may further include a first red emission layer disposed on the first pixel electrode for emitting red light. The second unit pixel may further include a second red emission layer disposed on the second pixel electrode for emitting red light. The first red emission layer may be spaced apart from the second red emission layer.

The display panel may further include a pixel-defining layer including a first opening and a second opening. The first opening defines an emission area of the first pixel electrode for emitting blue light. The second opening defines an emission area of the second pixel electrode for emitting blue light. At least a portion of the first blue emission layer may be located on a portion of the pixel-defining layer between the first pixel electrode for emitting blue light and the second pixel electrode for emitting blue light.

The third unit pixel may further include a third blue emission layer disposed on the third pixel electrode for emitting blue light. The fourth unit pixel may further include a fourth blue emission layer disposed on the fourth pixel electrode for emitting blue light. The third blue emission layer may be spaced apart from the fourth blue emission layer.

The display panel may further include a pixel-defining layer including a third opening and a fourth opening. The third opening defines an emission area of the third pixel electrode for emitting blue light. The fourth opening defines an emission area of the fourth pixel electrode for emitting blue light. A spacer is located on a portion of the pixel-defining layer between the third opening and the fourth opening.

BRIEF DESCRIPTION OF THE DRAWINGS

The above and other aspects, features, and elements of certain exemplary embodiments of the present disclosure will be more apparent from the following description taken in conjunction with the accompanying drawings, in which.

DETAILED DESCRIPTION

Figure 1:
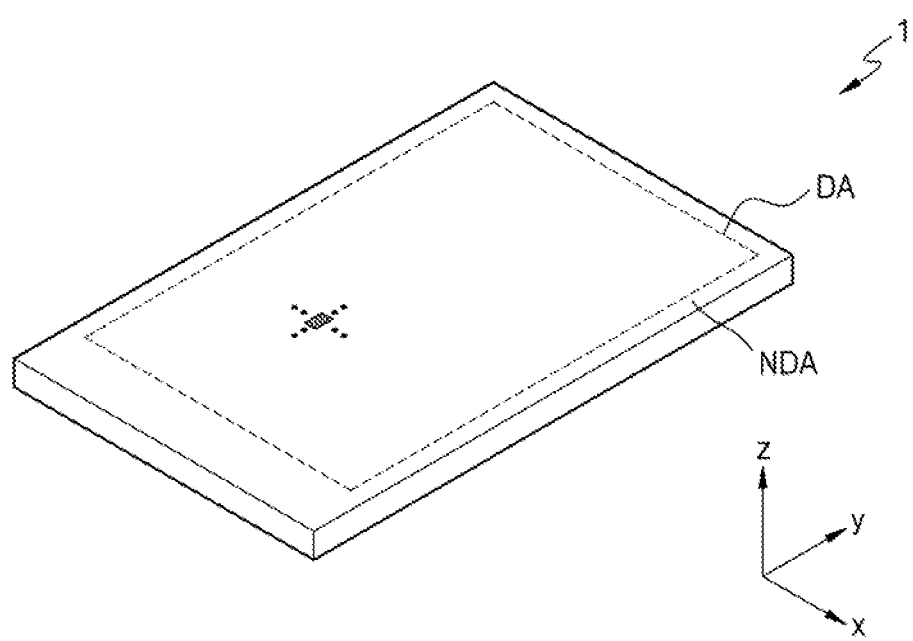
FIG. 1 is a perspective view illustrating a display device according to an exemplary embodiment of the present disclosure.

Reference will now be made in detail to embodiments, examples of which are illustrated in the accompanying drawings, wherein like reference numerals may refer to like elements throughout the specification and drawings. In this regard, the present embodiments may have different forms and may be variously modified from the descriptions set forth herein.

Hereinafter, the present embodiments are described in detail with reference to the accompanying drawings. In the drawings, the same reference numerals may be given to the same or corresponding elements, and to the extent that repeated description thereof is omitted, it may be assumed that the omitted details are at least similar to those details that have been describe elsewhere within the specification or illustrated elsewhere in the figures.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components. Whereas, the term "consisting of" is used to preclude the presence or addition of other features or components.

It will be understood that when a layer, region, or component is referred to as being "formed on," another layer, region, or component, it can be directly or indirectly formed on the other layer, region, or component. For example, for example, intervening layers, regions, or components may be present.

Sizes of elements in the drawings may be exaggerated for convenience of explanation. It is to be understood that the relative sizes, shapes and angles shown in the figures do represent characteristics of at least one exemplary embodiment of the present intention, however, these values may be variously changed within the scope of the present disclosure.

When a certain embodiment may be implemented differently, a specific process order may be performed differently from the described order. For example, two consecutively described processes may be performed substantially at the same time or performed in an order opposite to the described order.

In the present specification, "A and/or B" means A or B, or A and B. In the present specification, "at least one of A and B" means A or B, or A and B.

It will be understood that when a layer, region, or component is referred to as being "connected" to another layer, region, or component, it may be "directly connected" to the other layer, region, or component and/or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component and/or may be "indirectly electrically connected" to other layer, region, or component with other layer, region, or component interposed therebetween.

In the following examples, the x-axis, the y-axis and the z-axis are not limited to three axes of the Cartesian coordinate system, and may be interpreted in a broader sense. For example, the x-axis, the y-axis, and the z-axis may be perpendicular to one another, or may represent different directions that are not perpendicular to one another.

FIG. 1 is a perspective view illustrating a display device 1 according to an exemplary embodiment of the present disclosure.

Referring to FIG. 1, the display device 1 includes a display area DA through which an image is displayed and a non-display area NDA through which an image is not displayed. The display device 1 may display an image to the outside by using light emitted from the display area DA.

Figure 2:
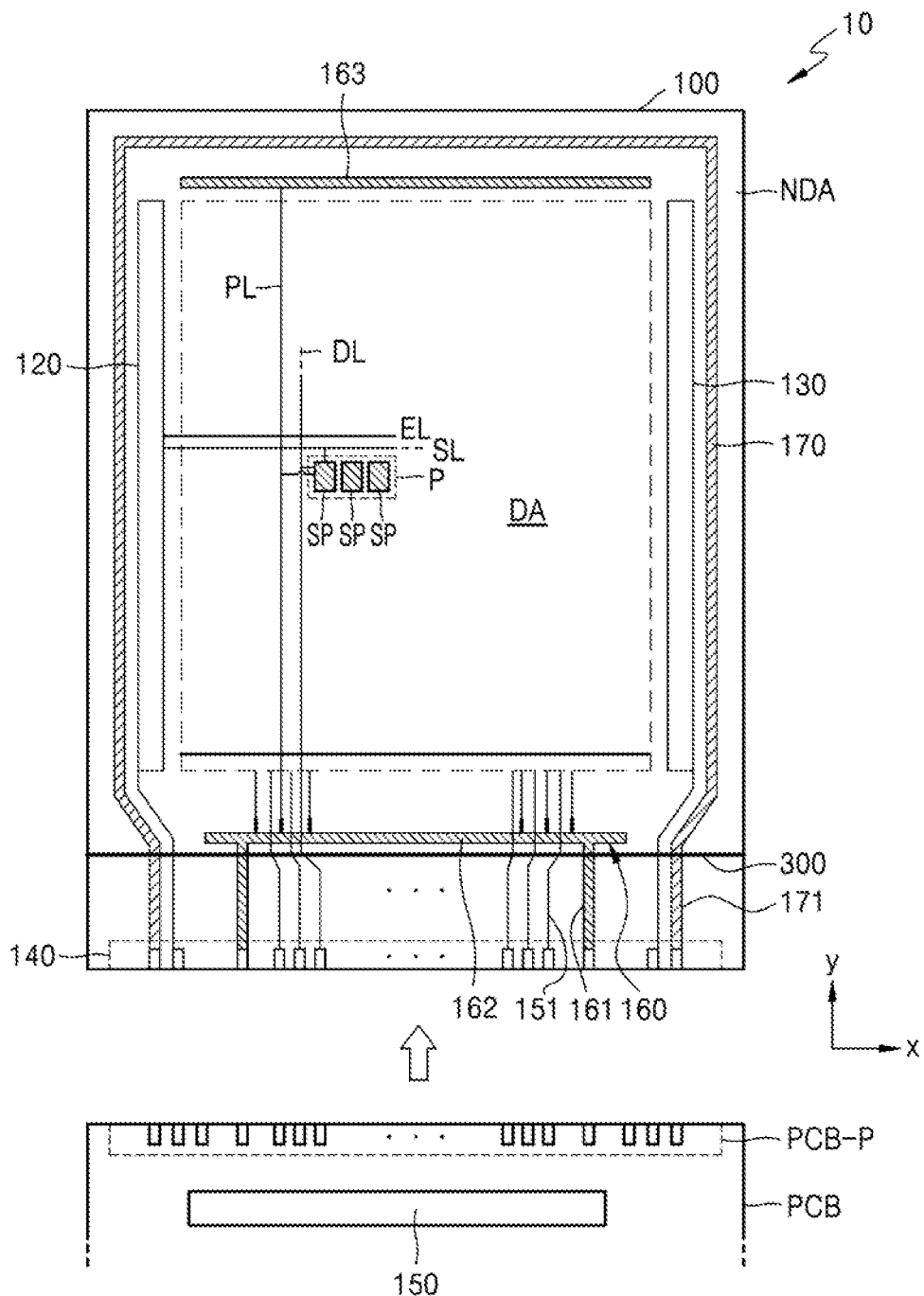
FIG. 2 is a plan view illustrating a display panel according to an exemplary embodiment of the present disclosure.

Though FIG. 1 shows the display device 1 in which the display area DA is quadrangular, the embodiment is not limited thereto. A shape of the display area DA may be a circle, an ellipse, or a polygon such as a triangle or a pentagon. Also, though it is shown in FIG. 1 that the display device 1 is a flat panel display device having a flat shape, the display device 1 may be various ones, for example, a flexible display device, a foldable display device, and/or a rollable display device.

the display device 1 may include a component located on one side of a display panel 10 (see FIG. 2). The component may be an electronic element that uses light or sound. For example, an electronic element may be a sensor such as an infrared sensor that emits and/or receives light, a camera that receives light and captures an image, a sensor that outputs and senses light or sound to measure a distance or recognize a fingerprint, a small lamp that outputs light, and/or a speaker that outputs sound.

Hereinafter, though the display device 1, according to an exemplary embodiment of the present disclosure, is described as an organic light-emitting diode (OLED) display device as an example, a display device according to the present disclosure is not limited thereto. According to an exemplary embodiment of the present disclosure, the display device 1 may be variously formed, for example, the display device 1 may be an inorganic light-emitting display or a quantum dot light-emitting display. For example, an emission layer of a display element provided to the display device 1 may include an organic material, an inorganic material, quantum dots, an organic material and quantum dots, or an inorganic material and quantum dots.

FIG. 2 is a plan view of the display panel 10 according to an exemplary embodiment of the present disclosure.

Referring to FIG. 2, the display device 1 includes a plurality of sub-pixels SP arranged in the display area DA of a substrate 100. Each of the plurality of sub-pixels SP may include a display element such as an organic light-emitting diode OLED. Each sub-pixel SP may emit, for example, red, green, blue, or white light through the organic light-emitting diode OLED.

At least one of the sub-pixels SP may be grouped in the display area DA to constitute one unit pixel P. In an exemplary embodiment of the present disclosure, a unit pixel P may include a plurality of sub-pixels each emitting light of different colors, for example, include a red sub-pixel R, a green sub-pixel G, and a blue sub-pixel B. However, the present disclosure is not limited thereto. According to an exemplary embodiment of the present disclosure, a unit pixel P may include two sub-pixels among a red sub-pixel, a green sub-pixel, and a blue sub-pixel, or include a red sub-pixel, a green sub-pixel, and a blue sub-pixel and two or more green sub-pixels. Various modifications may be made.

An encapsulation substrate 300 may be provided over the substrate 100. The encapsulation substrate 300 may face the substrate 100 with elements on the substrate 100 disposed therebetween. The encapsulation substrate 300 may be attached on the substrate 100 by using sealant located in the non-display area NDA, and the encapsulation substrate 300 may prevent a display element such as the organic light-emitting diode OLED from being exposed to external air and moisture by sealing the display area DA from the outside.

In an exemplary embodiment of the present disclosure, the display area DA may be protected from external air or moisture by being at least partially covered by a thin-film encapsulation layer instead of the encapsulation substrate 300. The thin-film encapsulation layer may be provided as a singular body so as to correspond to an entire surface of the display area DA and arranged in also the non-display area NDA. The thin-film encapsulation layer may be provided so as to cover all or a portion of a first scan driving circuit 120, a second scan driving circuit 130, a data driving circuit 150, a first power supply line 160, and a second power supply line 170. Since the organic light-emitting diode OLED is vulnerable to external factors such as moisture, oxygen, etc., the reliability of the display panel 10 may be increased by sealing the organic light-emitting diode OLED using the thin-film encapsulation layer. In the case where the thin-film encapsulation layer is provided instead of the encapsulation substrate 300, a thickness of the display panel 10 may be reduced and simultaneously the flexibility of the display panel 10 may be increased.

Each sub-pixel SP may be electrically connected to outer circuits arranged in the non-display area NDA. The first scan driving circuit 120, the second scan driving circuit 130, a terminal 140, the data driving circuit 150, the first power supply line 160, and the second power supply line 170 may each be arranged in the non-display area NDA.

The first scan driving circuit 120 may provide a scan signal to each sub-pixel SP through a scan line SL. The first scan driving circuit 120 may provide an emission control signal to each sub-pixel SP through an emission control line EL. The second scan driving circuit 130 may be arranged in parallel to the first scan driving circuit 120 with the display area DA disposed therebetween. Some of the sub-pixels SP arranged in the display area DA may be electrically connected to the first scan driving circuit 120, and the rest of the sub-pixels SP may be connected to the second scan driving circuit 130. According to an exemplary embodiment of the present disclosure, the second scan driving circuit 130 may be omitted.

The terminal 140 may be arranged on one side of the substrate 100. The terminal 140 may be exposed and electrically connected to a printed circuit board PCB through an opening of an insulating layer. A terminal PCB-P of the printed circuit board PCB may be electrically connected to the terminal 140 of the display panel 10. The printed circuit board PCB transfers a signal of a controller or power to the display panel 10.

A control signal generated by the controller may be transferred to the first and second scan driving circuits 110 and 120 through the printed circuit board PCB. The controller may respectively provide first and second power voltages ELVDD and ELVSS to the first and second power supply lines 160 and 170 through first and second connection lines 161 and 171. The first power voltage ELVDD may be provided to each sub-pixel SP through a driving voltage line PL connected to the first power supply line 160, and the second power voltage ELVSS may be provided to an opposite electrode of each sub-pixel SP that is connected to the second power supply line 170.

The data driving circuit 150 is electrically connected to the data line DL. A data signal of the data driving circuit 150 may be provided to each sub-pixel SP through a connection line 151 connected to the terminal 140, and the data line DL connected to the connection line 151. Though it is shown in FIG. 2 that the data driving circuit 150 is arranged on the printed circuit board PCB, the data driving circuit 150 may be arranged on the substrate 100 according to an exemplary embodiment of the present disclosure. For example, the data driving circuit 150 may be arranged between the terminal 140 and the first power supply line 160.

The first power supply line 160 may include a first sub-line 162 and a second sub-line 163 that extend in parallel to each other in an x-direction with the display area DA disposed therebetween. The second power supply line 170 may have a loop shape having an open one side and partially surround the display area DA.

Figure 3:
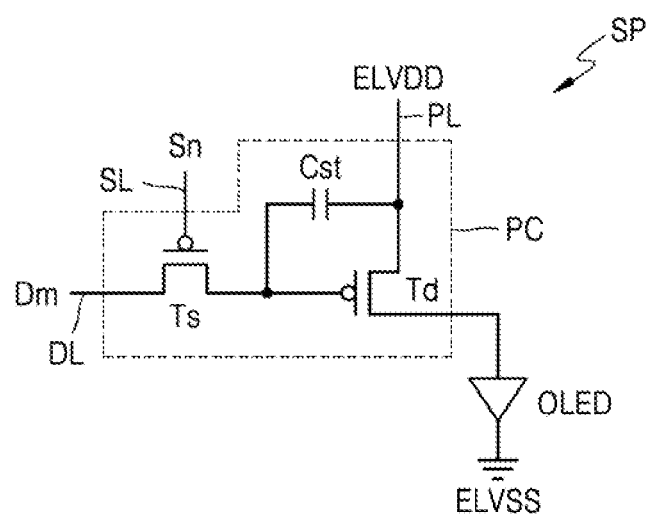
FIGS. 3 and 4 are equivalent circuit diagrams illustrating a sub-pixel that may be included in a display device according to an exemplary embodiment of the present disclosure.
Figure 4:
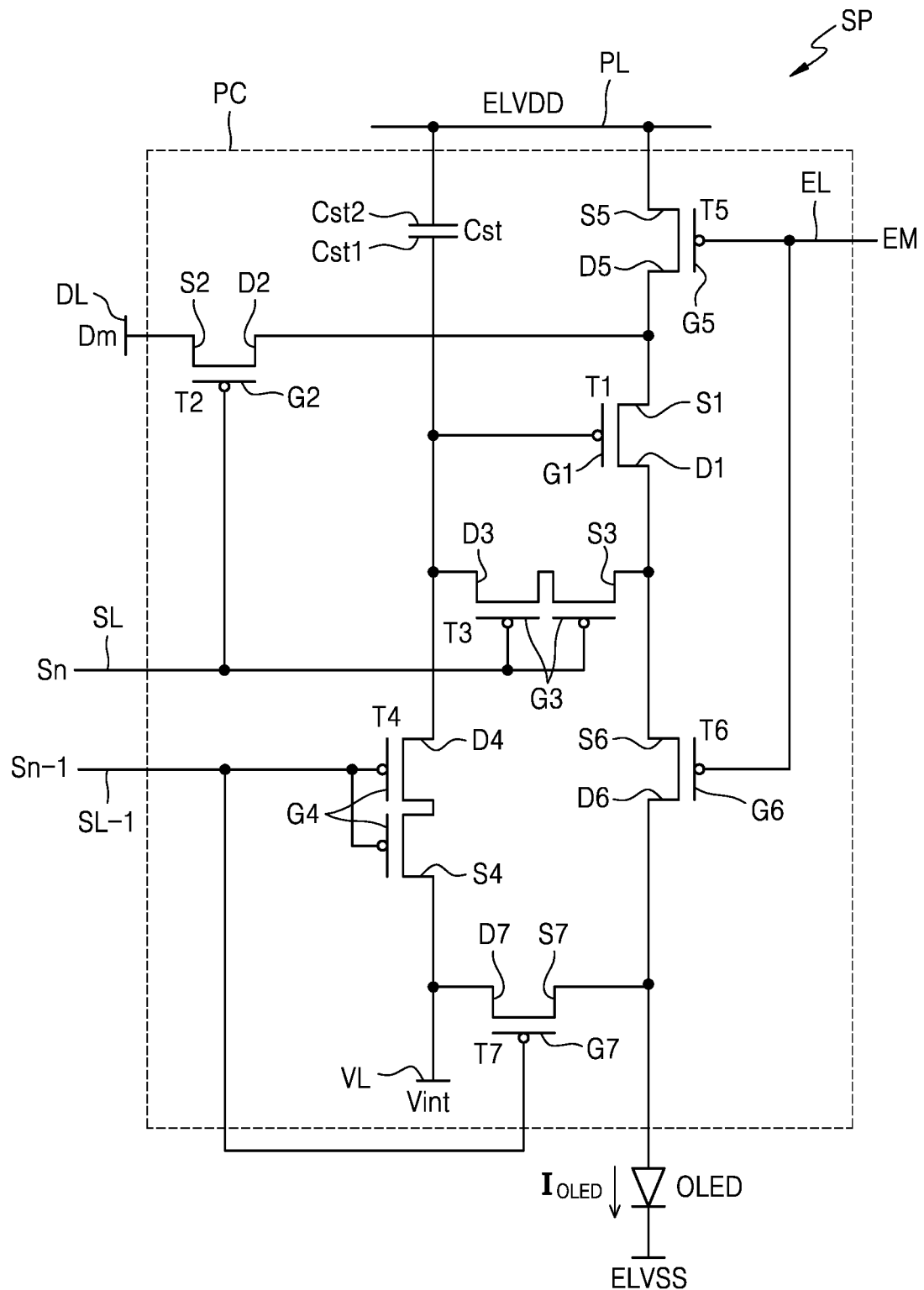

FIGS. 3 and 4 are equivalent circuit diagrams of a sub-pixel that may be included in the display device 1, according to an exemplary embodiment of the present disclosure.

Referring to FIG. 3, each sub-pixel SP includes a pixel circuit PC and an organic light-emitting diode OLED, the pixel circuit PC being connected to a scan line SL and a data line DL, and the organic light-emitting diode OLED being connected to the pixel circuit PC.

The pixel circuit PC includes a driving thin film transistor Td, a switching thin film transistor Ts, and a storage capacitor Cst. The switching thin film transistor Ts is connected to the scan line SL and the data line DL, and transfers a data signal Dm input through the data line DL to the driving thin film transistor Td in response to a scan signal Sn input through the scan line SL.

The storage capacitor Cst is connected to the switching thin film transistor Ts and the driving voltage line PL, and stores a voltage corresponding to a difference between a voltage transferred from the switching thin film transistor Ts and the first power voltage ELVDD (or a driving voltage) supplied to the driving voltage line PL.

The driving thin film transistor Td is connected to the driving voltage line PL and the storage capacitor Cst, and may control a driving current flowing through the organic light-emitting diode OLED from the driving voltage line PL in response to a voltage value stored in the storage capacitor Cst. The organic light-emitting diode OLED may emit light having a predetermined brightness by using the driving current.

The pixel circuit PC may include two thin film transistors and one storage capacitor, however, other arrangements may be used. According to an exemplary embodiment of the present disclosure, as shown in FIG. 4, the pixel circuit PC may include seven thin film transistors and one storage capacitor. According to an exemplary embodiment of the present disclosure, the pixel circuit PC may include two or more storage capacitors.

Referring to FIG. 4, a sub-pixel SP may include the pixel circuit PC and an organic light-emitting diode OLED connected to the pixel circuit PC. The pixel circuit PC may include a plurality of thin film transistors and a storage capacitor. The thin film transistors and the storage capacitor may be connected to signal lines SL, SL−1, EL, and DL, an initialization voltage line VL, and the driving voltage line PL.

Each sub-pixel SP may be connected to the signal lines SL, SL−1, EL, and DL, the initialization voltage line VL, and the driving voltage line PL, however, other arrangements may be used. According to an exemplary embodiment of the present disclosure, at least one of the signal lines SL, SL−1, EL, and DL, the initialization voltage line VL, and the driving voltage line PL may be shared by pixels that neighbor each other.

The plurality of thin film transistors may include a driving thin film transistor T1, a switching thin film transistor T2, a compensation thin film transistor T3, a first initialization thin film transistor T4, an operation control thin film transistor T5, an emission control thin film transistor T6, and a second initialization thin film transistor T7.

The signal lines include the scan line SL, a previous scan line SL−1, the emission control line EL, and the data line DL, the scan line SL transferring a scan signal Sn, the previous scan line SL−1 transferring a previous scan signal Sn−1 to the first initialization thin film transistor T4 and the second initialization thin film transistor T7, the emission control line EL transferring an emission control signal En to the operation control thin film transistor T5 and the emission control thin film transistor T6, and the data line DL intersecting with the scan line SL and transferring a data signal Dm.

The driving voltage line PL transfers the driving voltage ELVDD to the driving thin film transistor T1, and the initialization voltage line VL transfers an initialization voltage Vint initializing the driving thin film transistor T1 and a pixel electrode of the organic light-emitting diode OLED.

A driving gate electrode G1 of the driving thin film transistor T1 is connected to a first storage capacitor plate Cst1 of the storage capacitor Cst, a driving source electrode S1 of the driving thin film transistor T1 is connected to the driving voltage line PL through the operation control thin film transistor T5, and a driving drain electrode D1 of the driving thin film transistor T1 is electrically connected to the pixel electrode of an organic light-emitting diode OLED through the emission control thin film transistor T6. The driving thin film transistor T1 receives a data signal Dm depending on a switching operation of the switching thin film transistor T2 and supplies a driving current $I_{OLED}$ to the organic light-emitting diode OLED.

A switching gate electrode G2 of the switching thin film transistor T2 is connected to the scan line SL, a switching source electrode S2 of the switching thin film transistor T2 is connected to the data line DL, and a switching drain electrode D2 of the switching thin film transistor T2 is connected to the driving source electrode S1 of the driving thin film transistor T1 and simultaneously connected to the driving voltage line PL through the operation control thin film transistor T5. The switching thin film transistor T2 is turned on in response to a scan signal Sn transferred through the scan line SL and performs a switching operation of transferring a data signal Dm transferred through the data line DL to the driving source electrode S1 of the driving thin film transistor T1.

A compensation gate electrode G3 of the compensation thin film transistor T3 is connected to the scan line SL. A compensation source electrode S3 of the compensation thin film transistor T3 is connected to the driving drain electrode D1 of the driving thin film transistor T1 and is simultaneously connected to the pixel electrode of the organic light-emitting diode OLED through the emission control thin film transistor T6. A compensation drain electrode D3 of the compensation thin film transistor T3 is connected to the first storage capacitor plate Cst1 of the storage capacitor Cst, a first initialization drain electrode D4 of the first initialization thin film transistor T4, and the driving gate electrode G1 of the driving thin film transistor T1. The compensation thin film transistor T3 is turned on in response to a scan signal Sn transferred through the scan line SL and diode-connects the driving thin film transistor T1 by electrically connecting the driving gate electrode G1 to the driving drain electrode D1 of the driving thin film transistor T1.

A first initialization gate electrode G4 of the first initialization thin film transistor T4 is connected to the previous scan line SL−1. A first initialization source electrode S4 of the first initialization thin film transistor T4 is connected to a second initialization drain electrode D7 of the second initialization thin film transistor T7 and the initialization voltage line VL. A first initialization drain electrode D4 of the first initialization thin film transistor T4 is connected to the first storage capacitor plate Cst1 of the storage capacitor Cst, the compensation drain electrode D3 of the compensation thin film transistor T3, and the driving gate electrode G1 of the driving thin film transistor T1. The first initialization thin film transistor T4 is turned on in response to a previous scan signal Sn−1 transferred through the previous scan line SL−1 and performs an initialization operation of transferring an initialization voltage Vint to the driving gate electrode G1 of the driving thin film transistor T1, thereby initializing a voltage of the driving gate electrode G1 of the driving thin film transistor T1.

An operation control gate electrode G5 of the operation control thin film transistor T5 is connected to the emission control line EL, an operation control source electrode S5 of the operation control thin film transistor T5 is connected to the driving voltage line PL, and an operation control drain electrode D5 of the operation control thin film transistor T5 is connected to the driving source electrode S1 of the driving thin film transistor T1 and the switching drain electrode D2 of the switching thin film transistor T2.

An emission control gate electrode G6 of the emission control thin film transistor T6 is connected to the emission control line EL. An emission control source electrode S6 of the emission control thin film transistor T6 is connected to the driving drain electrode D1 of the driving thin film transistor T1 and the compensation source electrode S3 of the compensation thin film transistor T3. An emission control drain electrode D6 of the emission control thin film transistor T6 is connected to the second initialization source electrode S7 of the second initialization thin film transistor T7 and the pixel electrode of the organic light-emitting diode OLED.

The operation control thin film transistor T5 and the emission control thin film transistor T6 are simultaneously turned on in response to an emission control signal En transferred through the emission control line EL to allow the driving voltage ELVDD to be transferred to the organic light-emitting diode OLED and thus the driving current $I_{OLED}$ to flow through the organic light-emitting diode OLED.

A second initialization gate electrode G7 of the second initialization thin film transistor T7 is connected to the previous scan line SL−1. The second initialization source electrode S7 of the second initialization thin film transistor T7 is connected to the emission control drain electrode D6 of the emission control thin film transistor T6 and the pixel electrode of the organic light-emitting diode OLED. The second initialization drain electrode D7 of the second initialization thin film transistor T7 is connected to the first initialization source electrode S4 of the first initialization thin film transistor T4 and the initialization voltage line VL. The second initialization thin film transistor T7 is turned on in response to a previous scan signal Sn−1 transferred through the previous scan line SL−1 and initializes the pixel electrode of the organic light-emitting diode OLED.

Though FIG. 4 shows the case where the first initialization thin film transistor T4 and the second initialization thin film transistor T7 are connected to the previous scan line SL−1, the embodiment is not limited thereto. According to an exemplary embodiment of the present disclosure, the first initialization thin film transistor T4 may be connected to the previous scan line SL−1 and driven in response to a previous scan signal Sn−1. The second initialization thin film transistor T7 may be connected to a separate signal line (for example, the next scan line) and driven in response to a signal transferred through the separate signal line.

A second storage capacitor plate Cst2 of the storage capacitor Cst is connected to the driving voltage line PL, and an opposite electrode of the organic light-emitting diode OLED is connected to the common voltage ELVSS. Therefore, the organic light-emitting diode OLED may receive the driving current $I_{OLED}$ from the driving thin film transistor T1 and emit light to thereby display an image.

The compensation thin film transistor T3 and the first initialization thin film transistor T4 may each have a dual gate electrode. The compensation thin film transistor T3 and the first initialization thin film transistor T4 may each have one gate electrode.

Figure 5:
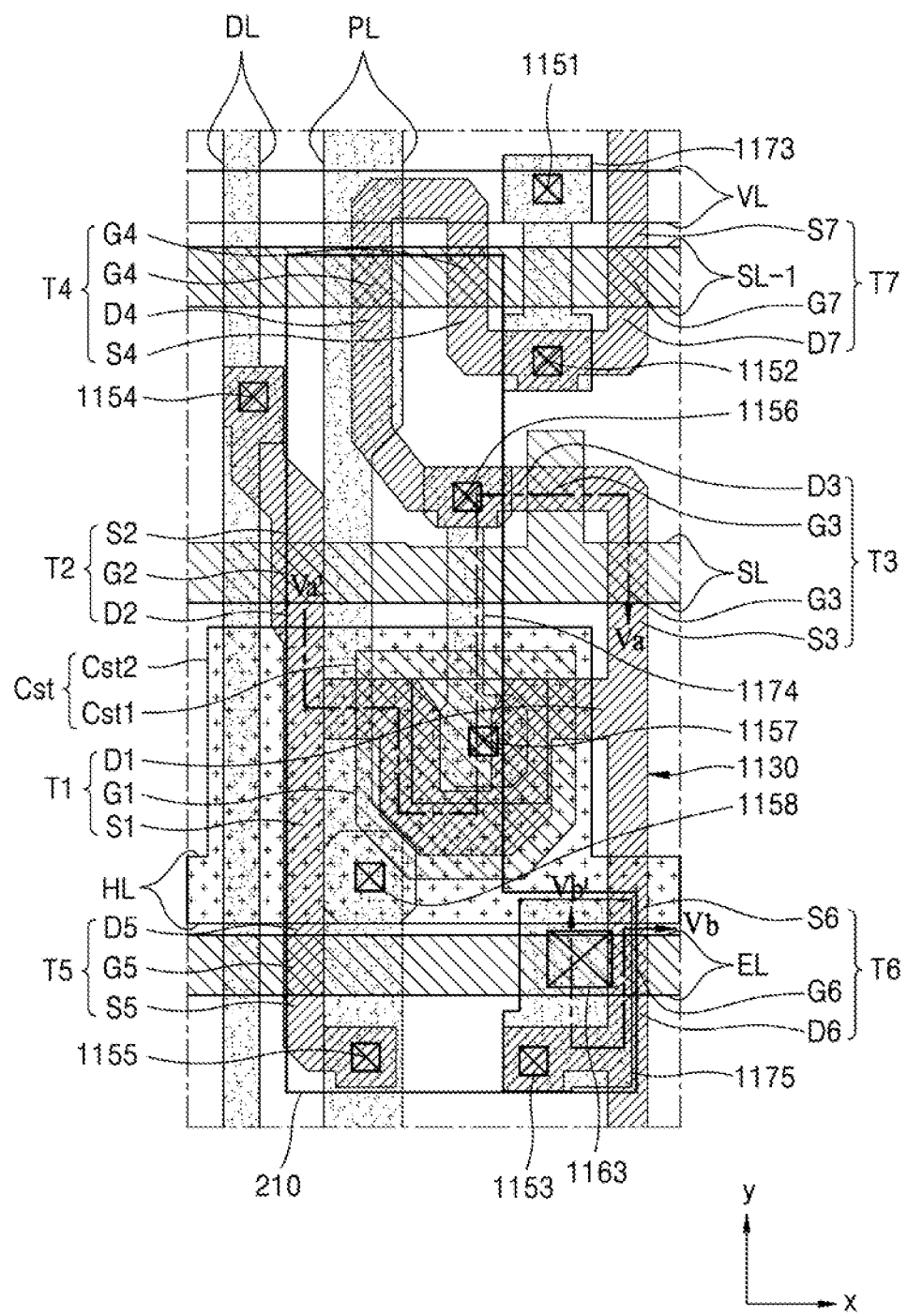
FIG. 5 is a plan view illustrating a pixel circuit of one sub-pixel of a display panel according to an exemplary embodiment of the present disclosure.
Figure 6:
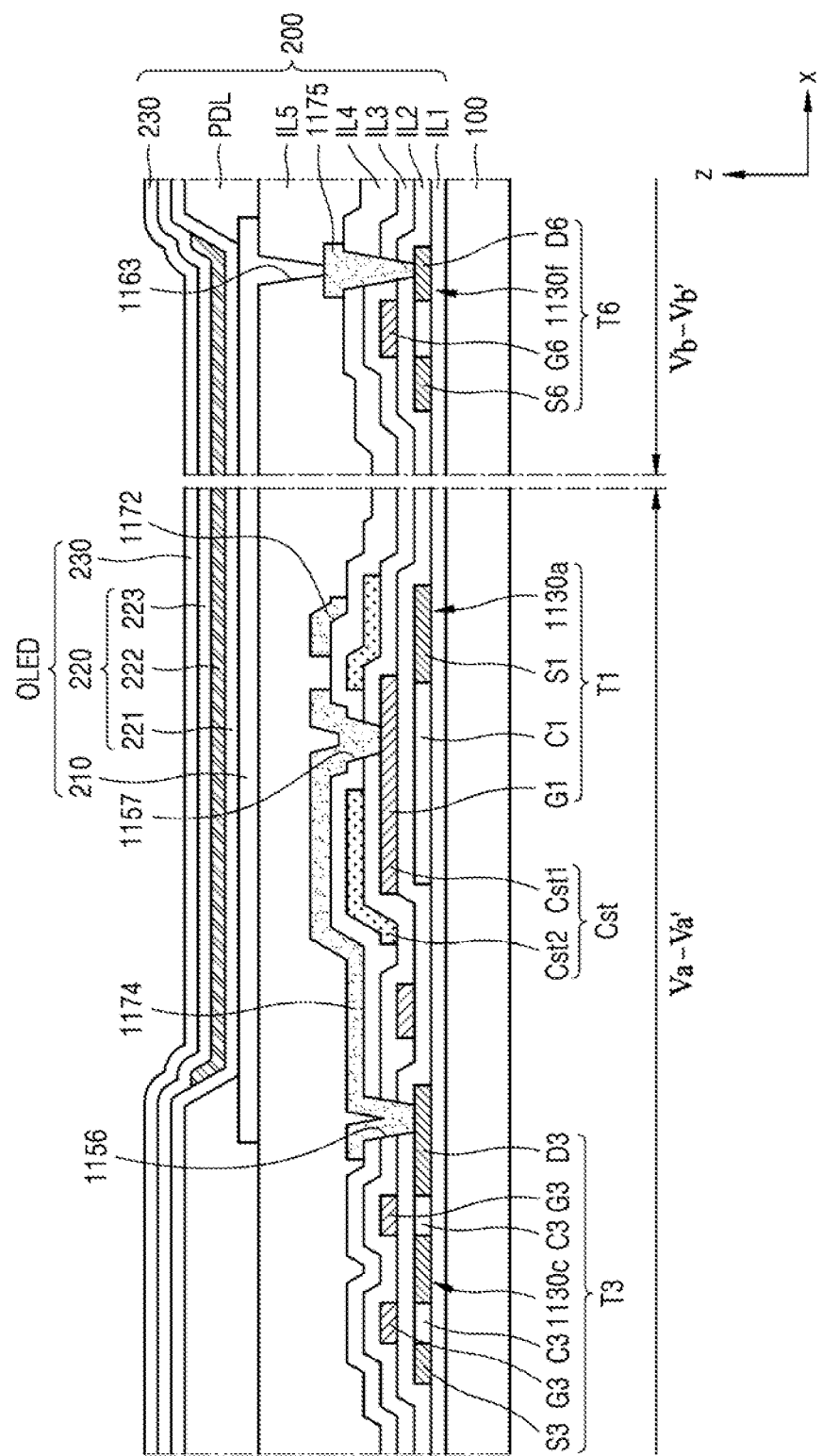
FIG. 6 is a cross-sectional view illustrating a pixel circuit taken along lines Va-Va' and Vb-Vb' of FIG. 5.

FIG. 5 is a plan view illustrating a pixel circuit of one sub-pixel of a display panel according to an exemplary embodiment of the present disclosure. FIG. 6 is a cross-sectional view illustrating a pixel circuit taken along lines Va-Va' and Vb-Vb' of FIG. 5.

Referring to FIGS. 5 and 6, a semiconductor layer 1130 is arranged over the substrate 100. The substrate 100 may include glass or a polymer resin. The polymer resin may include polyethersulfone (PES), polyacrylate, polyetherimide (PEI), polyethylene naphthalate (PEN), polyethylene terephthalate (PET), polyphenylene sulfide (PPS), polyarylate, polyimide (PI), polycarbonate (PC), and/or cellulose acetate propionate (CAP). The substrate 100 including the polymer resin may be flexible (e.g. able to be flexed to a noticeable extent without braking), rollable (e.g. able to be rolled up upon itself without breaking), and/or bendable (e.g. able to be bent to a noticeable extent without breaking). The substrate 100 may have a multi-layered structure including a layer including the above polymer resin and an inorganic layer. The encapsulation substrate 300 may include glass or the polymer resin.

The driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 are arranged along the semiconductor layer 1130. As shown in FIG. 5, the semiconductor layer 1130 is located over the substrate 100. A buffer layer IL1 (see FIG. 6) is arranged under the semiconductor layer 1130. The buffer layer IL1 includes an inorganic material such as silicon oxide, silicon nitride, and/or silicon oxynitride.

Some regions of the semiconductor layer 1130 correspond to semiconductor layers of the driving thin film transistor T1, the switching thin film transistor T2, the compensation thin film transistor T3, the first initialization thin film transistor T4, the operation control thin film transistor T5, the emission control thin film transistor T6, and/or the second initialization thin film transistor T7. For example, the semiconductor layers of the driving thin film transistor T1, the switching thin film transistor T2, the compensation thin film transistor T3, the first initialization thin film transistor T4, the operation control thin film transistor T5, the emission control thin film transistor T6, and/or the second initialization thin film transistor T7 may be connected to each other and bent in various shapes.

FIG. 6 illustrates a driving semiconductor layer 1130a of the driving thin film transistor T1, a compensation semiconductor layer 1130c of the compensation thin film transistor T3, and an emission control semiconductor layer 1130f of the emission control thin film transistor T6 that correspond to some regions of the semiconductor layer 1130.

The semiconductor layer 1130 includes a channel region, a source region, and a drain region. The source region and the drain region are on two opposite sides of the channel region. It may be understood that the source region and the drain region are respectively a source electrode and a drain electrode of a relevant thin film transistor. Hereinafter, for convenience of description, a source region and a drain region are referred to as a source electrode and a drain electrode.

The driving thin film transistor T1 includes the driving gate electrode G1, the driving source electrode S1, and the driving drain electrode D1, the driving gate electrode G1 overlapping a driving channel region, and the driving source electrode S1 and the driving drain electrode D1 being disposed on two opposite sides of the driving channel region. The driving channel region overlaps the driving gate electrode G1 and may form a long channel length in a narrow space by having a structure bent in various shapes. For example, the driving channel region may be provided in an omega shape, a letter 'S' shape, etc. In the case where the length of the driving channel region is relatively long, a driving range of a gate voltage widens and gradation of light emitted from an organic light-emitting diode OLED may be more elaborately controlled, and a display quality may be increased.

The switching thin film transistor T2 includes the switching gate electrode G2, the switching source electrode S2, and the switching drain electrode D2, the switching gate electrode G2 overlapping a switching channel region, and the switching source electrode S2 and the switching drain electrode D2 being on two opposite sides of the switching channel region. The switching drain electrode D2 may be connected to the driving source electrode S1.

The compensation thin film transistor T3 is a dual thin film transistor and may include the compensation gate electrodes G3, the compensation source electrode S3, and the compensation drain electrode D3. The compensation gate electrodes G3 overlaps two compensation channel regions. The compensation source electrode S3 and the compensation drain electrode D3 are disposed on two opposite sides of the compensation channel region. The compensation thin film transistor T3 may be connected to the driving gate electrode G1 of the driving thin film transistor T1 through a node connection line 1174 described below.

The first initialization thin film transistor T4 is a dual thin film transistor and may include the first initialization gate electrodes G4, the first initialization source electrode S4, and the first initialization drain electrode D4. The first initialization gate electrodes G4 overlaps two first initialization channel regions. The first initialization source electrode S4 and the first initialization drain electrode D4 are on two opposite sides of the first initialization channel region.

The operation control thin film transistor T5 may include the operation control gate electrode G5, the operation control source electrode S5, and the operation control drain electrode D5. The operation control gate electrode G5 overlaps an operation control channel region. The operation control source electrode S5 and the operation control drain electrode D5 are on two opposite sides of the operation control channel region. The operation control drain electrode D5 may be connected to the driving source electrode S1.

The emission control thin film transistor T6 may include the emission control gate electrode G6, the emission control source electrode S6, and the emission control drain electrode D6. The emission control gate electrode G6 overlaps an emission control channel region. The emission control source electrode S6 and the emission control drain electrode D6 are disposed on two opposite sides of the emission control channel region. The emission control source electrode S6 may be connected to the driving drain electrode D1.

The second initialization thin film transistor T7 may include the second initialization gate electrode G7, the second initialization source electrode S7, and the second initialization drain electrode D7. The second initialization gate electrode G7 overlaps a second initialization channel region. The second initialization source electrode S7 and the second initialization drain electrode D7 are disposed on two opposite sides of the second initialization channel region.

The above-described thin film transistors may be connected to the signal lines SWL, SIL, EL, and DL, the initialization voltage line VL, and the driving voltage line PL.

A gate insulating layer IL2 (see FIG. 6) may be arranged on the semiconductor layer 1130. The scan line SL, the previous scan line SL−1, the emission control line EL, and the driving gate electrode G1 may be arranged on the gate insulating layer IL2. The gate insulating layer IL2 may include an inorganic material such as silicon oxide, silicon nitride, and/or silicon oxynitride. The scan line SL, the previous scan line SL−1, the emission control line EL, and the driving gate electrode G1 may include a metal such as Mo, Al, Cu, Ti, and/or an alloy thereof.

The scan line SL may extend primarily in an x-direction. Some regions of the scan line SL may respectively correspond to the switching and compensation gate electrodes G2 and G3. For example, regions of the scan line SL that overlap the switching and compensation thin film transistors T2 and T3 may be the switching and compensation gate electrodes G2 and G3, respectively.

The previous scan line SL−1 may extend primarily in the x-direction and some regions of the previous scan line SL−1 may respectively correspond to the first and second initialization gate electrodes G4 and G7. For example, regions of the previous scan line SL−1 that at least partially overlap the channel regions of the first and second initialization thin film transistors T4 and T7 may be the first and second initialization gate electrodes G4 and G7, respectively.

The emission control line EL may extend primarily in the x-direction. Some regions of the emission control line EL may respectively correspond to the operation control and emission control gate electrodes G5 and G6. For example, regions of the emission control line EL that at least partially overlap the channel regions of the operation control and emission control thin film transistors T6 and T7 may be the operation control and emission control gate electrodes G5 and G6, respectively.

The driving gate electrode G1 is a floating electrode and may be connected to the compensation thin film transistor T3 through the node connection line 1174.

The initialization voltage line VL may extend primarily in the x-direction. The initialization voltage line VL may be connected to the first and second initialization thin film transistors T4 and T7 through an initialization connection line 1173 described below.

The initialization voltage line VL may be arranged on a planarization insulating layer IL5. The initialization voltage line VL may be arranged on the gate insulating layer IL2 and may include the same material as those of the scan line SL, the previous scan line SL−1, the emission control line EL, and the driving gate electrode G1 according to an exemplary embodiment of the present disclosure.

An electrode voltage line HL may be arranged over each of the scan line SL, the previous scan line SL−1, the emission control line EL, and the driving gate electrode G1 with a first interlayer insulating layer IL3 (see FIG. 6) including an inorganic material being disposed therebetween.

As shown in FIG. 6, the electrode voltage line HL may extend primarily in the x-direction so as to intersect with the data line DL and the driving voltage line PL. A portion of the electrode voltage line HL may cover at least a portion of the driving gate electrode G1 and may constitute the storage capacitor Cst in cooperation with the driving gate electrode G1. For example, the driving gate electrode G1 may serve as the first storage capacitor plate Cst1 of the storage capacitor Cst, and a portion of the electrode voltage line HL may serve as the second storage capacitor plate Cst2 of the storage capacitor Cst.

The driving voltage line PL and the second storage capacitor plate Cst2 are electrically connected to the driving voltage line PL. For example, it is shown in FIG. 6 that the electrode voltage line HL is connected to the driving voltage line PL arranged on the electrode voltage line HL through a contact hole 1158. The electrode voltage line HL may have the same voltage level (a constant voltage, e.g. +5V) as that of the driving voltage line PL. It may be understood that the electrode voltage line HL is a kind of a driving voltage line in a transverse direction.

Since the driving voltage line PL extends primarily in a y-direction and the electrode voltage line HL electrically connected to the driving voltage line PL extends primarily in the x-direction, a plurality of driving voltage lines PL and electrode voltage lines HL may constitute a mesh structure in the display area DA.

The data line DL, the driving voltage line PL, the initialization connection line 1173, and the node connection line 1174 may be arranged over the second storage capacitor plate Cst2 and the electrode voltage line HL with a second interlayer insulating layer IL4 (see FIG. 6) including an inorganic material disposed therebetween. The data line DL, the driving voltage line PL, the initialization connection line 1173, and the node connection line 1174 may have a single layer structure or a multi-layer structure including Al, Cu, and/or Ti. In an exemplary embodiment of the present disclosure, the driving voltage line PL and the data line DL may each have a multi-layered structure of Ti/Al/Ti.

The data line DL may extend primarily in the y-direction and be connected to the switching source electrode S2 of the switching thin film transistor T2 through a contact hole 1154. A portion of the data line DL may be the switching source electrode S2.

The driving voltage line PL may extend primarily in the y-direction and be connected to the electrode voltage line HL through the contact hole 1158 as described above. Also, the driving voltage line PL may be connected to the operation control thin film transistor T5 through a contact hole 1155. The driving voltage line PL may be connected to the operation control drain electrode D5 through the contact hole 1155.

One end of the initialization connection line 1173 may be connected to the first and second initialization thin film transistors T4 and T7 through a contact hole 1152, and the other end of the initialization connection line 1173 may be connected to the initialization voltage line VL through a contact hole 1151.

One end of the node connection line 1174 may be connected to the compensation drain electrode D3 through a contact hole 1156, and the other end of the node connection line 1174 may be connected to the driving gate electrode G1 through a contact hole 1157.

The planarization insulating layer IL5 is located on the data line DL, the driving voltage line PL, the initialization connection line 1173, and the node connection line 1174. A pixel electrode 210 is arranged on the planarization insulating layer IL5.

Unlike FIG. 6, the initialization voltage line VL may be arranged on the same layer on which the pixel electrode 210 of the organic light-emitting diode OLED is arranged and may include the same material as that of the pixel electrode 210. The pixel electrode 210 may be connected to the emission control thin film transistor T6. The pixel electrode 210 may be connected to a contact metal layer 1175 through a contact hole 1163, and the contact metal layer 1175 may be connected to the emission control drain electrode D6 through a contact hole 1153.

Referring to FIG. 6, edges of the pixel electrode 210 may be at least partially covered by a pixel-defining layer PDL on the planarization insulating layer IL5 (see FIG. 6), and a central region of the pixel electrode 210 may be exposed through an opening of the pixel-defining layer PDL. The pixel electrode 210 may include a reflective layer including Ag, Mg, Al, Pt, Pd, Au, Ni, Nd, Ir, Cr, and/or a compound thereof. According to an exemplary embodiment of the present disclosure, the pixel electrode 210 may further include a layer including ITO, IZO, ZnO, and/or $In_2O_3$ on/under the reflective layer. An intermediate layer 220 is arranged on a portion of the pixel electrode 210 that is exposed through the opening.

The intermediate layer 220 includes an emission layer 222 on the portion of the pixel electrode 210 that is exposed through the opening of the pixel-defining layer PDL. The emission layer 222 may include a polymer organic material or a low molecular weight organic material emitting light of a predetermined color. In an exemplary embodiment of the present disclosure, as shown in FIG. 6, the intermediate layer 220 may include a first functional layer 221 under the emission layer 222 and/or a second functional layer 223 on the emission layer 222.

Figure 8:
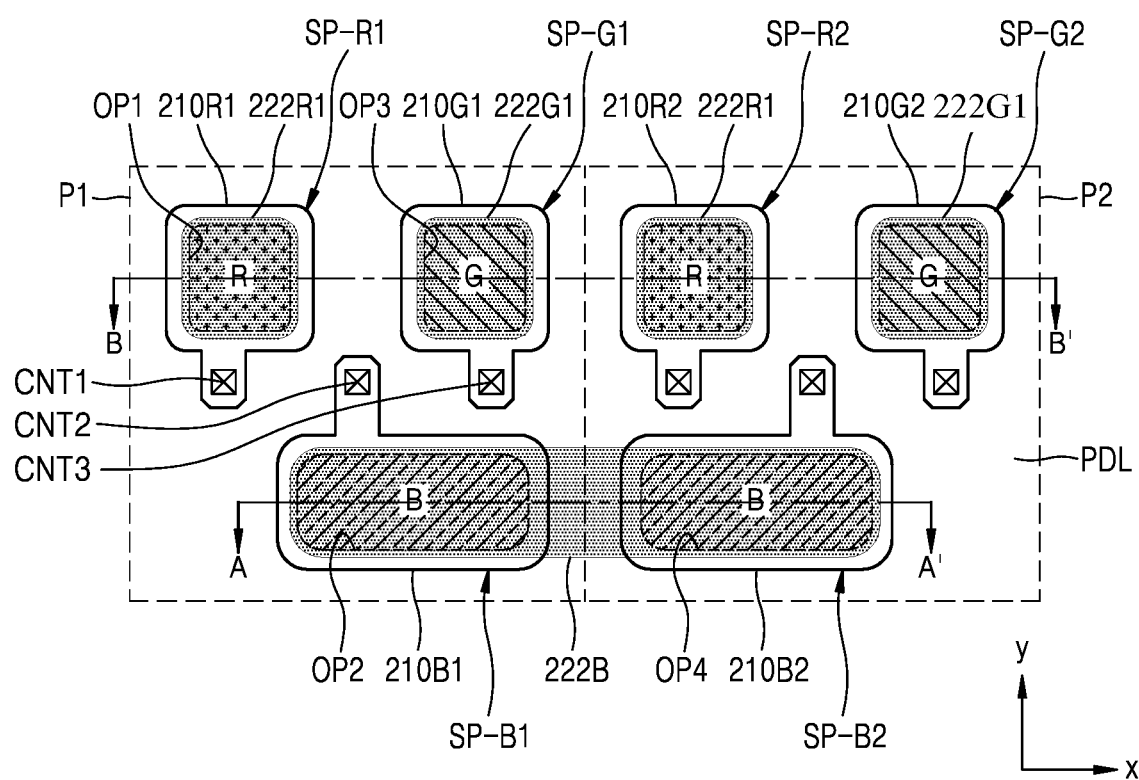
FIGS. 8 and 9 are plan views illustrating a portion of a display area of a display panel according to an exemplary embodiment of the present disclosure.

Though it is shown in FIG. 6 that the emission layer 222 is patterned to correspond to the pixel electrode 210, the emission layer 222 may be successively provided to correspond to a plurality of pixel electrodes 210 as shown in FIG. 8 described below. This is described below in detail with reference to FIG. 8.

The first functional layer 221 may have a single layer structure or a multi-layer structure. For example, in the case where the first functional layer includes a polymer material, the first functional layer may be a hole transport layer (HTL), which has a single-layered structure. The first functional layer may include poly-(3,4)-ethylene-dihydroxy thiophene (PEDOT) or polyaniline (PANI). In the case where the first functional layer includes a low molecular weight material, the first functional layer may include a hole injection layer (HIL) and a hole transport layer (HTL).

The second functional layer may be omitted. For example, in the case where the first functional layer 221 and the emission layer 222 include a polymer material, it is preferable that the second functional layer 223 is formed to make a characteristic of the organic light-emitting diode OLED excellent. The second functional layer 223 may have a single layer structure or a multi-layer structure. The second functional layer 223 may include an electron transport layer (ETL) and/or an electron injection layer (EIL).

An opposite electrode 230 faces the pixel electrode 210 with the intermediate layer 220 disposed therebetween. The opposite electrode 230 may include a conductive material having a low work function. For example, the opposite electrode 230 may include a (semi) transparent layer including Ag, Mg, Al, Pt, Pd, Au, Ni, Nd, Ir, Cr, Li, Ca, and/or an alloy thereof. Alternatively, the opposite electrode 230 may further include a layer including ITO, IZO, ZnO, and/or $In_2O_3$ on/under the (semi) transparent layer including the above material.

Figure 7:
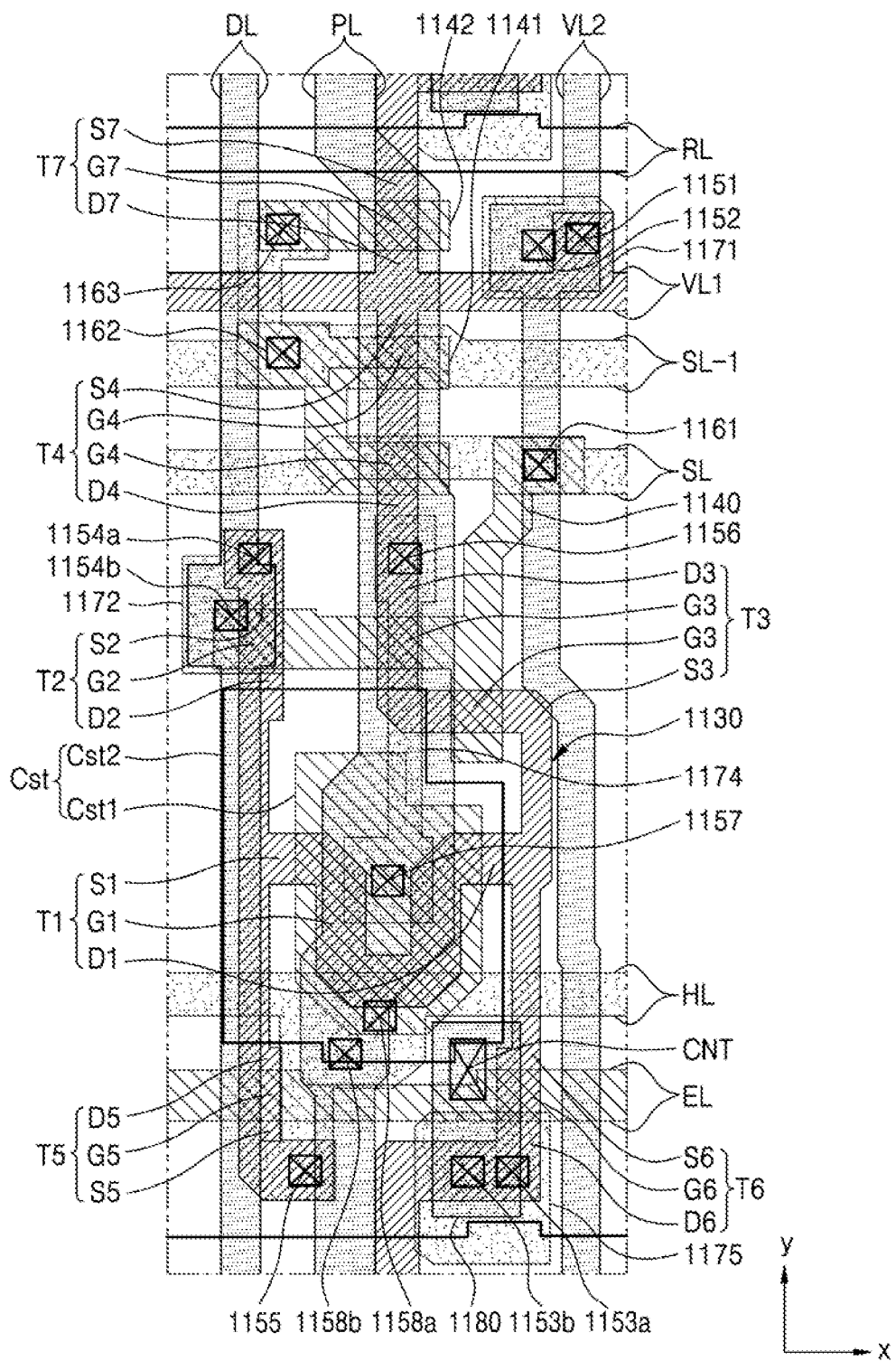
FIG. 7 is a plan view illustrating a pixel circuit of one sub-pixel of a display panel according to an exemplary embodiment of the present disclosure.

FIG. 7 is a plan view illustrating a pixel circuit of one sub-pixel of a display panel according to an exemplary embodiment of the present disclosure.

A pixel of FIG. 7 may include seven thin film transistors T1 to T7 and one storage capacitor Cst which are the same as those of the equivalent circuit diagram shown in FIG. 5.

Referring to FIG. 7, the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 are arranged along the semiconductor layer 1130. The semiconductor layer 1130 is arranged over a substrate on which a buffer layer including an inorganic insulating material is formed.

Some regions of the semiconductor layer 1130 correspond to semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7. For example, the semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 may be connected to each other and bent in various shapes.

The semiconductor layer 1130 includes a channel region, a source region, and a drain region. The source region and the drain region are disposed on two opposite sides of the channel region. It may be understood that the source region and the drain region are respectively a source electrode and a drain electrode of a relevant thin film transistor. Hereinafter, for convenience of description, a source region and a drain region are referred to as a source electrode and a drain electrode.

According to exemplary embodiments of the present disclosure, the semiconductor layer 1130 includes a first initialization voltage line VL1 extending primarily in the x-direction. A second initialization voltage line VL2 extending primarily in the y-direction may be located over the first initialization voltage line VL1 with an insulating layer(s) disposed therebetween. The first initialization voltage line VL1 may be electrically connected to the second initialization voltage line VL2 through the contact holes 1151 and 1152 to constitute a mesh structure. The first and second initialization voltage lines VL1 and VL2 may have a constant voltage (e.g. −2V, etc.).

The driving thin film transistor T1 includes the driving gate electrode G1, the driving source electrode S1, and the driving drain electrode D1. The driving gate electrode G1 may overlap the driving channel region. The driving source electrode S1 and the driving drain electrode D1 are on two opposite sides of the driving channel region. The driving channel region overlaps the driving gate electrode G1 and may form a long channel length in a narrow space by having a bent shape such as an omega shape. In the case where the length of the driving channel region is relatively long, a driving range of a gate voltage widens and gradation of light emitted from an organic light-emitting diode OLED may be more elaborately controlled, and a display quality may be increased.

The switching thin film transistor T2 includes the switching gate electrode G2, the switching source electrode S2, and the switching drain electrode D2, the switching gate electrode G2 overlapping the switching channel region, and the switching source electrode S2 and the switching drain electrode D2 being on two opposite sides of the switching channel region. The switching drain electrode D2 may be connected to the driving source electrode S1.

The compensation thin film transistor T3 is a dual thin film transistor and may include the compensation gate electrodes G3, the compensation source electrode S3, and the compensation drain electrode D3. The compensation gate electrodes G3 overlaps two compensation channel regions. The compensation source electrode S3 and the compensation drain electrode D3 are disposed on two opposite sides of the compensation channel region. The compensation thin film transistor T3 may be connected to the driving gate electrode G1 of the driving thin film transistor T1 through the node connection line 1174 described below.

The first initialization thin film transistor T4 is a dual thin film transistor and may include the first initialization gate electrodes G4, the first initialization source electrode S4, and the first initialization drain electrode D4. The first initialization gate electrodes G4 overlaps two first initialization channel regions. The first initialization source electrode S4 and the first initialization drain electrode D4 are disposed on two opposite sides of the first initialization channel region.

The operation control thin film transistor T5 may include the operation control gate electrode G5, the operation control source electrode S5, and the operation control drain electrode D5. The operation control gate electrode G5 overlaps an operation control channel region. The operation control source electrode S5 and the operation control drain electrode D5 are disposed on two opposite sides of the operation control channel region. The operation control drain electrode D5 may be connected to the driving source electrode S1.

The emission control thin film transistor T6 may include the emission control gate electrode G6, the emission control source electrode S6, and the emission control drain electrode D6. The emission control gate electrode G6 overlaps an emission control channel region. The emission control source electrode S6 and the emission control drain electrode D6 are disposed on two opposite sides of the emission control channel region. The emission control source electrode S6 may be connected to the driving drain electrode D1.

The second initialization thin film transistor T7 may include the second initialization gate electrode G7, the second initialization source electrode S7, and the second initialization drain electrode D7. The second initialization gate electrode G7 overlaps a second initialization channel region. The second initialization source electrode S7 and the second initialization drain electrode D7 are disposed on two opposite sides of the second initialization channel region.

A first initialization gate pattern 1141 is provided as the first initialization gate electrode G4. A second initialization gate pattern 1142 is provided as the second initialization gate electrode G7. The first and second initialization gate patterns 1141 and 1142 may each be provided as floating metals having an island shape. The first and second initialization gate patterns 1141 and 1142 may be electrically connected to the previous scan line SL−1 and may receive a signal set in advance.

The thin film transistors may be connected to the signal lines SL, SL−1, EL, and DL, the first and second initialization voltage lines VL1 and VL2, and the driving voltage line PL.

A gate pattern 1140 may be arranged over the semiconductor layer 1130 with an insulating layer(s) disposed therebetween. The gate pattern 1140 includes the emission control line EL, the driving gate electrode G1, the first and second initialization gate electrodes G4 and G7, and the switching and compensation gate electrodes G2 and G3.

The emission control line EL extends primarily in the x-direction. Some regions of the emission control line EL may respectively correspond to the operation control gate electrode G5 and the emission control gate electrode G6. For example, regions of the emission control line EL that overlap the channel regions of the operation control and emission control thin film transistors T6 and T7 may respectively be the operation control gate electrode G5 and the emission control gate electrode G6.

The driving gate electrode G1, the first and second initialization gate electrodes G4 and G7, and the gate pattern 1140 may be provided as floating electrodes having an island shape. The driving gate electrode G1 may be connected to the compensation thin film transistor T3 through the node connection line 1174. The first and second initialization gate electrodes G4 and G7 may be electrically connected to the previous scan line SL−1 described below. The gate pattern 1140 may include the switching and compensation gate electrodes G2 and G3 that overlap the semiconductor layer 1130.

The second storage capacitor plate Cst2 and a repair line RL may be arranged over the gate pattern 1140 with an insulating layer(s) disposed therebetween. The gate pattern 1140 includes the emission control line EL, the driving gate electrode G1, the first and second initialization gate electrodes G4 and G7, and the switching and compensation gate electrodes G2 and G3.

The second storage capacitor plate Cst2 may overlap a portion of the driving gate electrode G1 and constitute the storage capacitor Cst in cooperation with the driving gate electrode G1.

The repair line RL may extend primarily in the x-direction. The repair line RL may recover disconnection of a signal line through a repair process when a defect occurs inside a pixel circuit.

The scan line SL, the previous scan line SL−1, the electrode voltage line HL, the node connection line 1174, and contact metal layers 1171, 1172, and 1175 may be arranged over the second storage capacitor plate Cst2 and the repair line RL with an insulating layer(s) disposed therebetween.

The scan line SL may extend primarily in the x-direction. The scan line SL may be electrically connected to the gate pattern 1140 through a contact hole 1161. Some regions of the gate pattern 1140 to which a scan signal is applied through the scan line SL may correspond to the switching and compensation gate electrodes G2 and G3.

The previous scan line SL−1 may extend primarily in the x-direction and be connected to the first and second initialization gate electrodes G4 and G7 through contact holes 1162 and 1163. The second initialization gate electrode G7 may have a dual gate electrode structure.

The electrode voltage line HL may extend primarily in the x-direction so as to intersect with the data line DL and the driving voltage line PL. The electrode voltage line HL may be connected to the operation control thin film transistor T5 through a contact hole 1155. The electrode voltage line HL may be electrically connected to the second storage capacitor plate Cst2 through a contact hole 1158a, the second storage capacitor plate Cst2 being under the electrode voltage line HL. The electrode voltage line HL may be connected to the operation control source electrode S5 through the contact hole 1155.

Also, the electrode voltage line HL may be connected to the driving voltage line PL through a contact hole 1158b, the driving voltage line PL being arranged on the electrode voltage line HL. Therefore, the electrode voltage line HL may have the same voltage level (e.g. a constant voltage) as that of the driving voltage line PL. For example, the electrode voltage line HL may have a constant voltage of +5V. It may be understood that the electrode voltage line HL is a driving voltage line extending primarily in a transverse direction.

One end of the node connection line 1174 may be connected to the compensation drain electrode D3 through the contact hole 1156, and another end of the node connection line 1174 may be connected to the driving gate electrode G1 through the contact hole 1157.

The contact metal layers 1171, 1172, and 1175 electrically connect conductive layers (e.g. signal lines DL and VL2 and a connection electrode 1180) to the semiconductor layer 1130. The conductive layers are arranged over the contact metal layers 1171, 1172, and 1175 with an insulating layer(s) disposed therebetween. The semiconductor layer 1130 are arranged below the contact metal layers 1171, 1172, and 1175 with an insulating layer(s) disposed therebetween.

The contact metal layer 1171 may be connected to the first initialization voltage line VL1 extending primarily in the x-direction through the contact hole 1152, and may be connected to the second initialization voltage line VL2 extending primarily in the y-direction through the contact hole 1151. In an exemplary embodiment of the present disclosure, the second initialization voltage line VL2 might not be provided to some sub-pixels.

The contact metal layer 1172 may be connected to the source electrode S2 of the switching thin film transistor T2 through a contact hole 1154a, and connected to the data line DL through a contact hole 1154b.

The contact metal layer 1175 may be connected to the drain electrode D6 of the emission control thin film transistor T6 through a contact hole 1153a and connected to the connection electrode 1180 for being connected to the pixel electrode 210 (see FIG. 6) through a contact hole 1153b.

The data line DL, the driving voltage line PL, the second initialization voltage line VL2, and the connection electrode 1180 may be arranged over the scan line SL, the previous scan line SL−1, the electrode voltage line HL, the node connection line 1174, and the contact metal layers 1171, 1172, and 1175 with an insulating layer(s) disposed therebetween.

The data line DL may extend primarily in the y-direction and be connected to the switching source electrode S2 of the switching thin film transistor T2 through the contact holes 1154a and 1154b. A portion of the data line DL may be the switching source electrode S2.

The driving voltage line PL may extend primarily in the y-direction and be connected to the electrode voltage line HL through the contact hole 1158b as described above. Also, the driving voltage line PL may be connected to the operation control thin film transistor T5 through the contact hole 1155.

The second initialization voltage line VL2 may be connected to the first initialization voltage line VL1 through the contact metal layer 1171. The first initialization voltage line VL1 may extend primarily in the x-direction, and the second initialization voltage line VL2 may extend primarily in the y-direction to constitute a mesh structure.

As shown in FIG. 6, the pixel-defining layer PDL and the organic light-emitting diode OLED may be arranged over the pixel circuit of FIG. 7, the organic light-emitting diode OLED including the pixel electrode 210, the intermediate layer 220, and the opposite electrode 230.

Figure 9:
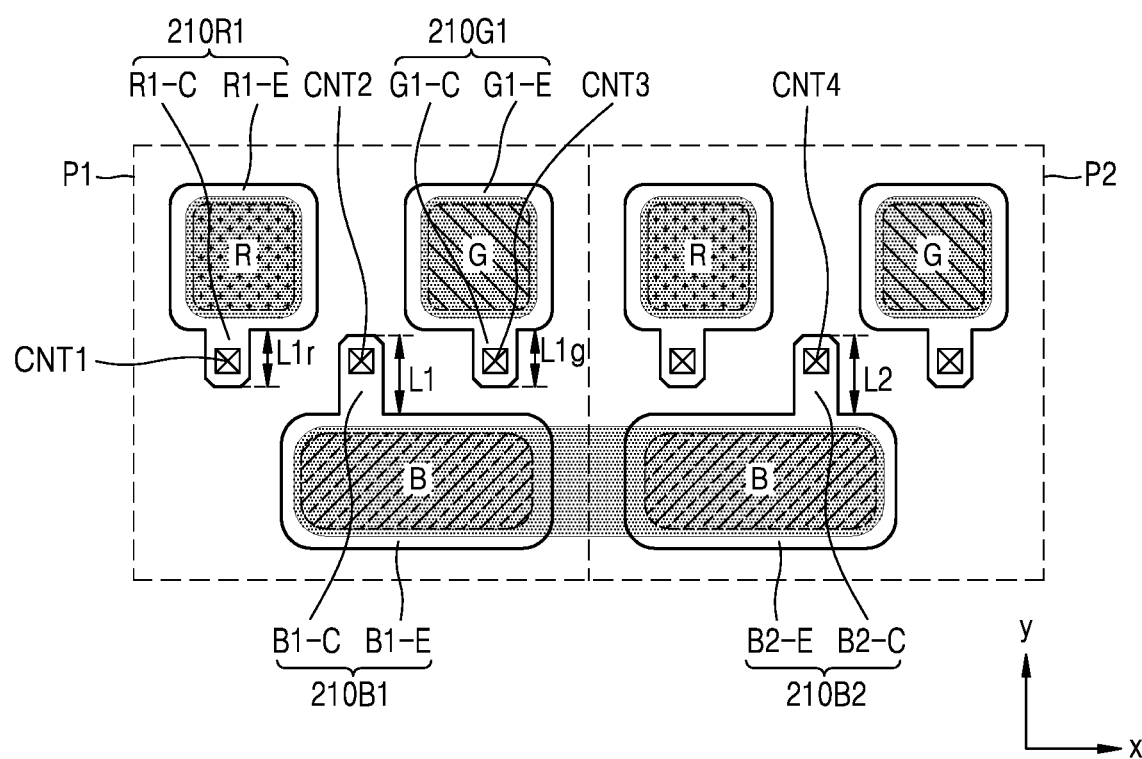

FIGS. 8 and 9 are plan views illustrating a portion of a display area of a display panel according to an exemplary embodiment of the present disclosure.

As shown in FIG. 2, the plurality of unit pixels P are arranged in the display area DA, and each unit pixel P includes a plurality of sub-pixels SP. FIG. 8 shows the case where one unit pixel P includes three sub-pixels SP respectively emitting light of different colors.

Referring to FIGS. 8 and 9, a first unit pixel P1 and a second unit pixel P2 are provided in the display area DA, the first unit pixel P1 and the second unit pixel P2 neighboring each other in the x-direction (a first direction). The first unit pixel P1 and the second unit pixel P2 may constitute a pixel group and such a pixel group may be repeatedly arranged in the display area DA.

The first unit pixel P1 may include a first pixel electrode 210R1 for emitting red light, a first pixel electrode 210B1 for emitting blue light, and a first pixel electrode 210G1 for emitting green light. The first pixel electrode 210R1 for emitting red light is spaced apart from the first pixel electrode 210G1 for emitting green light in the x-direction (the first direction), and the first pixel electrode 210B1 for emitting blue light is spaced apart from the first pixel electrode 210R1 for emitting red light or the first pixel electrode 210G1 for emitting green light in the y-direction (a second direction) intersecting with the x-direction. Referring to FIG. 8, the first pixel electrode 210B1 for emitting blue light of the first unit pixel P1 may be spaced apart in the y-direction from the first pixel electrode 210G1 for emitting green light, and a second pixel electrode 210B2 for emitting blue light of the second unit pixel P2 may be spaced apart in the y-direction from a second pixel electrode 210R2 for emitting red light.

The pixel circuit PC shown in FIG. 5 or 7 may be arranged below the first pixel electrodes 210R, 210B, and 210G with an insulating layer(s) disposed therebetween. In this case, the insulating layer(s) may be the planarization insulating layer IL5 of FIG. 6. With regard to the first unit pixel P1, a first pixel circuit for emitting red light, a first pixel circuit for emitting blue light, and a first pixel circuit for emitting green light may be arranged over the substrate 100. The first pixel electrode 210R1 for emitting red light may be electrically connected to the first pixel circuit for emitting red light through a first contact hole CNT1 defined in an insulating layer(s), the first pixel electrode 210B1 for emitting blue light may be electrically connected to the first pixel circuit for emitting blue light through a second contact hole CNT2 defined in an insulating layer(s), and the first pixel electrode 210G1 for emitting green light may be electrically connected to the first pixel circuit for emitting green light through a third contact hole CNT3 defined in an insulating layer(s).

In this case, each of the contact holes CNT1, CNT2, and CNT3 may be a contact hole CNT of FIG. 5 or 7. For example, the first pixel electrodes 210R1, 210B1, and 210G1 may be respectively electrically connected to the pixel circuits through the contact holes CNT1, CNT2, and CNT3. The contact holes, for example, the first to third contact holes CNT1, CNT2, and CNT3, may be spaced apart from one another in the x-direction. Intervals between the contact holes, for example, the first to third contact holes CNT1, CNT2, and CNT3, may be generally the same, but the interval is not limited thereto. In FIG. 7, contact holes neighboring an area across which the second initialization voltage line VL2 passes may be further apart from each other compared to contact holes neighboring an area across which the second initialization voltage line VL2 does not pass.

Each of the first pixel electrodes 210R1, 210B1, and 210G1 may include an electrode portion and a connection portion. The first pixel electrode 210R1 for emitting red light may include a first electrode portion R1-E and a first connection portion R1-C extending from one side of the first electrode portion R1-E and overlapping the first contact hole CNT1. Also, the first pixel electrode 210B1 for emitting blue light may include a second electrode portion B1-E and a second connection portion B1-C extending from one side of the second electrode portion B1-E and overlapping the second contact hole CNT2. Also, the first pixel electrode 210G1 for emitting green light may include a third electrode portion G1-E and a third connection portion G1-C extending from one side of the third electrode portion G1-E and overlapping the third contact hole CNT3.

As shown in FIG. 9, the first connection portion R1-C, the second connection portion B1-C, and the third connection portion G1-C may extend primarily in the y-direction (e.g. the second direction). In an exemplary embodiment of the present disclosure, the first connection portion R1-C and the third connection portion G1-C may extend to a side in which the first pixel electrode 210B1 for emitting blue light is arranged, and the second connection portion B1-C may extend to the opposite side. The second connection portion B1-C may be located between the first connection portion R1-C and the third connection portion G1-C.

Similarly, the first pixel electrode 210B1 for emitting blue light of the second unit pixel P2 may include a fourth electrode portion B2-E and a fourth connection portion B2-C extending from one side of the fourth electrode portion B2-E and overlapping a fourth contact hole CNT4. Similar to the second connection portion B1-C, the fourth connection portion B2-C may extend primarily in the y-direction. A length L1 of the second connection portion B1-C in the y-direction may be substantially the same as a length L2 of the fourth connection portion B2-C.

Also, a length L1r of the first connection portion R1-C in the y-direction may be substantially the same as a length L1g of the third connection portion G1-C, but the present invention is not limited thereto. However, in each unit pixel, lengths of connection portions of pixel electrodes emitting light of the same color are the same. In a comparative example, in the case where lengths of connection portions of pixel electrodes emitting light of the same color are different from each other, for example, in the case where lengths of connection portions of pixel electrodes for emitting blue light included in the first unit pixel and the second unit pixel are different from each other, a difference between voltages applied to a first blue sub-pixel included in the first unit pixel and a second blue sub-pixel included in the second unit pixel may occur, which may cause emission non-uniformity.

The pixel-defining layer PDL may be arranged on the first pixel electrodes 210R1, 210B1, and 210G1 to define an emission area of each sub-pixel. The pixel-defining layer PDL may include a first opening OP1, a second opening OP2, and a third opening OP3. The first opening OP1 exposes a central portion of the first electrode portion R1-E corresponding to the first pixel electrode 210R1 for emitting red light. The second opening OP2 exposes a central portion of the second electrode portion B1-E corresponding to the first pixel electrode 210B1 for emitting blue light. The third opening OP3 exposes a central portion of the third electrode portion G1-E corresponding to the first pixel electrode 210G1 for emitting green light. In this case, the pixel-defining layer PDL exposes the central portion of the electrode portion may mean that the pixel-defining layer PDL at least partially covers edges of each pixel electrode and exposes at least a portion of the pixel electrode. Therefore, the first connection portion R1-C, the second connection portion B1-C, and the third connection portion G1-C may be at least partially covered by the pixel-defining layer PDL. An emission area of the first red sub-pixel SP-R1 may be defined through the first opening OP1 of the pixel-defining layer PDL. An emission area of the first blue sub-pixel SP-B1 may be defined through the second opening OP2 of the pixel-defining layer PDL. An emission area of the first green sub-pixel SP-G1 may be defined through the third opening OP3 of the pixel-defining layer PDL.

A first red emission layer 222R1 may be arranged on the first pixel electrode 210R1 for emitting red light. A first blue emission layer 222B may be arranged on the first pixel electrode 210B1 for emitting blue light. A first green emission layer 222G1 may be arranged on the first pixel electrode 210G1 for emitting green light. The first red emission layer 222R1 and the first green emission layer 222G1 may be patterned so as to respectively correspond to the first opening OP1 and the second opening OP2.

The first blue emission layer 222B is provided as a singular body on the first pixel electrode 210B1 for emitting blue light and the second pixel electrode 210B2 for emitting blue light. This is described below in detail.

The second unit pixel P2 is provided similarly to the first unit pixel P1. In an exemplary embodiment of the present disclosure, the second unit pixel P2 may be provided horizontally symmetrical with respect to the first unit pixel P1 in the y-direction.

The second unit pixel P2 may include a second pixel electrode 210R2 for emitting red light, a second pixel electrode 210B2 for emitting blue light, and a second pixel electrode 210G2 for emitting green light. The pixel circuit PC shown in FIG. 5 or 7 may be arranged below the second pixel electrodes, for example, the second pixel electrode 210R2 for emitting red light, the second pixel electrode 210B2 for emitting blue light, and the second pixel electrode 210G2 for emitting green light with an insulating layer(s) disposed therebetween. In this case, the insulating layer(s) may be the planarization insulating layer IL5 of FIG. 6. With regard to the second unit pixel P2, a second pixel circuit for emitting red light, a second pixel circuit for emitting blue light, and a second pixel circuit for emitting green light may be arranged over the substrate 100 and respectively electrically connected to the second pixel electrodes, for example, the second pixel electrode 210R2 for emitting red light, the second pixel electrode 210B2 for emitting blue light, and the second pixel electrode 210G2 for emitting green light through contact holes.

Similarly, the pixel-defining layer PDL may be arranged on the second pixel electrodes, for example, the second pixel electrode 210R2 for emitting red light, the second pixel electrode 210B2 for emitting blue light, and the second pixel electrode 210G2 for emitting green light to define an emission area of each sub-pixel. The pixel-defining layer PDL may include openings exposing at least a portion corresponding to the second pixel electrode 210R2 for emitting red light, the second pixel electrode 210B2 for emitting blue light, and the second pixel electrode 210G2 for emitting green light. Since a structure of the pixel-defining layer PDL is the same as that in the case of the first unit pixel P1, repeated description thereof is omitted.

A second red emission layer 222R2 may be arranged on the second pixel electrode 210R2 for emitting red light, a second blue emission layer 222B2 may be arranged on the second pixel electrode 210B2 for emitting blue light, and a second green emission layer 222G2 may be arranged on the second pixel electrode 210G2 for emitting green light. The second red emission layer 222R2 and the second green emission layer 222G2 may be patterned so as to respectively correspond to the first opening OP1 and the second opening OP2. For example, the first red emission layer 222R1 and the second red emission layer 222R2 are spaced apart from each other with respect to red sub-pixels SP-R1 and SP-R2, and the first green emission layer 222G1 and the second green emission layer 222G2 are apart from each other with respect to green sub-pixels SP-G1 and SP-G2.

In contrast, as described above, the first blue emission layer 222B may be provided as a singular body on the first pixel electrode 210B1 for emitting blue light and the second pixel electrode 210B2 for emitting blue light. For example, it may be understood that the first blue sub-pixel SP-B1 and the second blue sub-pixel SP-B2 include the first blue emission layer 222B in common and share a portion and another portion of the first blue emission layer 222B.

Figure 10:
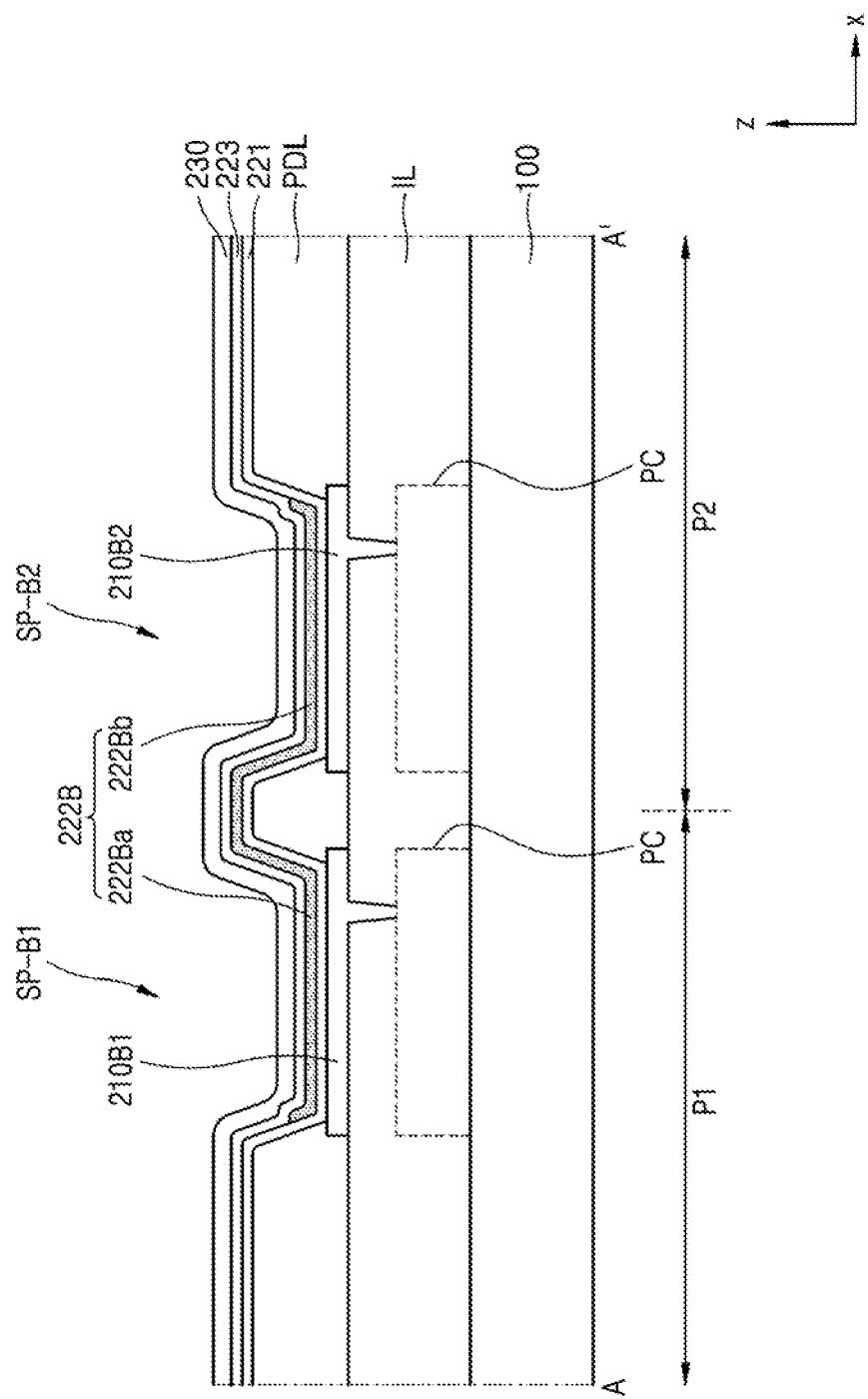
FIGS. 10 and 11 are cross-sectional views illustrating the display area taken along lines A-A' and B-B' of FIG. 8.
Figure 11:
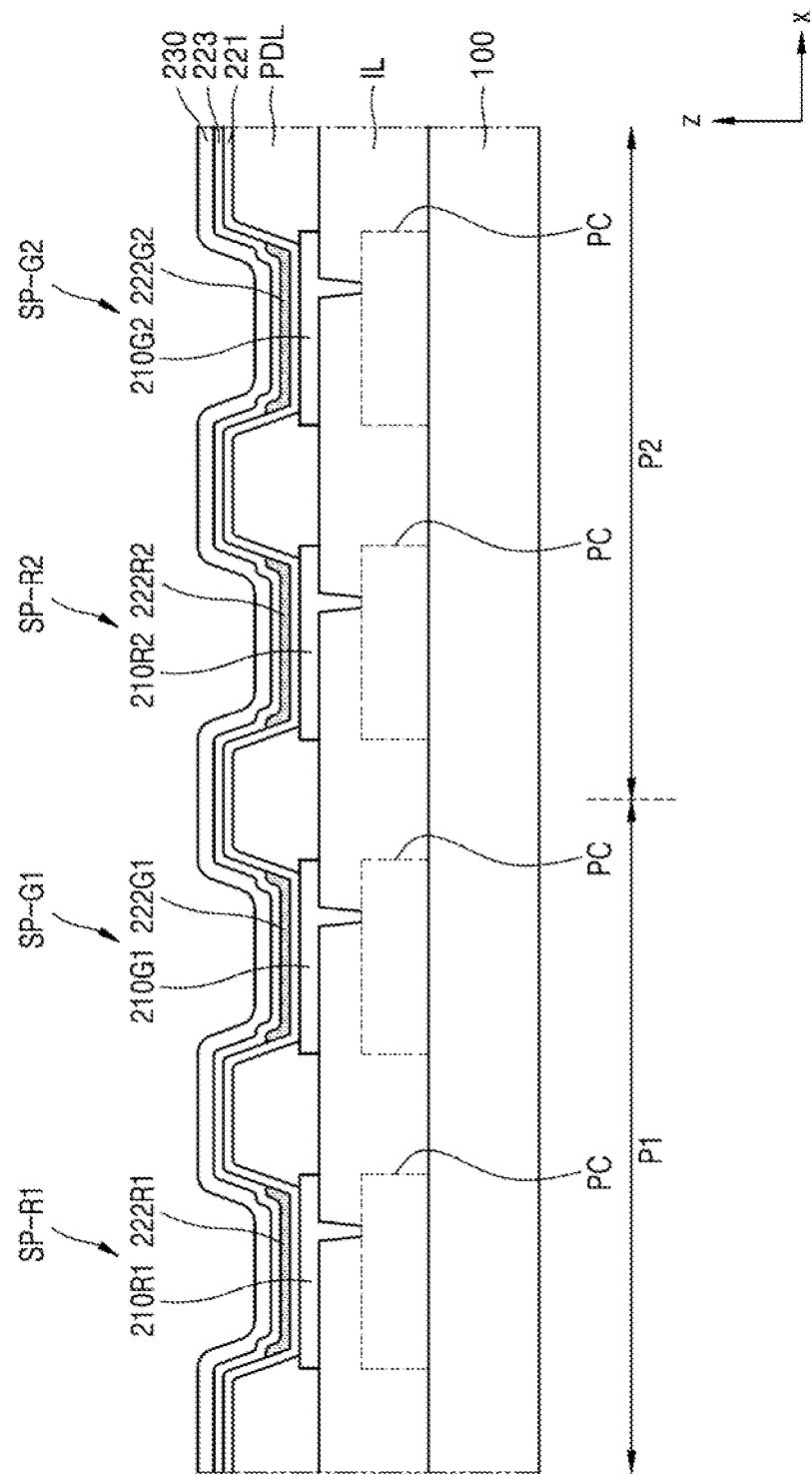

FIGS. 10 and 11 are cross-sectional views of a portion of the display area of the display panel according to an exemplary embodiment of the present disclosure. FIG. 10 corresponds to a cross-sectional view of the display area taken along line A-A' of FIG. 8, and FIG. 11 corresponds to a cross-sectional view of the display area taken along line B-B' of FIG. 8.

Referring to FIG. 10, the pixel circuits PC and the insulating layer IL may be arranged on the substrate 100. The pixel circuits PC may be electrically connected to the first pixel electrode 210B1 for emitting blue light and the second pixel electrode 210B2 for emitting blue light, respectively. The first blue emission layer 222B may be arranged over the first pixel electrode 210B1 for emitting blue light and the second pixel electrode 210B2 for emitting blue light.

The first functional layer 221 and the second functional layer 223 described above with reference to FIG. 6 may be respectively arranged under and on the first blue emission layer 222B. Similar to the opposite electrode 230, the first functional layer 221 and the second functional layer 223 may be provided as a singular body over the entire surface of the display area DA.

The first blue emission layer 222B may include a first portion 222Ba and a second portion 222Bb, the first portion 222Ba corresponding to the first pixel electrode 210B1 for emitting blue light, and the second portion 222Bb corresponding to the second pixel electrode 210B2 for emitting blue light. For example, the first blue sub-pixel SP-B1 may include, as a display element, the first pixel electrode 210B1 for emitting blue light, the first portion 222Ba of the first blue emission layer 222B, and the opposite electrode 230. The second blue sub-pixel SP-B2 may include, as a display element, the second pixel electrode 210B2 for emitting blue light, the second portion 222Bb of the first blue emission layer 222B, and the opposite electrode 230. The opposite electrode 230 may be provided as a singular body and may respectively correspond to the sub-pixels, for example, the first and second blue sub-pixels SP-B1 and SP-B2.

In an exemplary embodiment of the present disclosure, emission layers may be formed by using a mask process, for example, a fine metal mask (FMM). Open regions are formed in the mask so as to respectively correspond to sub-pixels. Emission layers having the same pattern as that of the open regions may be formed through the open regions. During a manufacturing process, the first blue emission layer 222B may be formed through an open region that corresponds to the first blue sub-pixel SP-B1 and the second blue sub-pixel SP-B2 in common.

Recently, display panels have been designed with higher resolutions, and an interval (a pitch) between open regions formed in a mask has become narrow, which causes lots of problems in manufacturing the mask. Therefore, an interval (a pitch) between open regions may be wide in forming a mask. Therefore, in the display panel 10 according to an embodiment, since one blue emission layer (for example, the first blue emission layer 222B) corresponding to two blue sub-pixels that neighbor each other (for example, the first blue sub-pixel SP-B1 and the second blue sub-pixel SP-B2) is provided, the display panel may be easily manufactured.

As shown in FIG. 10, at least a portion of the first blue emission layer 222B may be located over a top surface of the pixel-defining layer PDL. At least a portion of the first blue emission layer 222B may be located on a portion of the pixel-defining layer PDL between the first pixel electrode 210B1 for emitting blue light and the second pixel electrode 210B2 for emitting blue light. The first functional layer 221 and the second functional layer 223 may be arranged with the first blue emission layer 222B disposed therebetween on a portion of the pixel-defining layer PDL between the first pixel electrode 210B1 for emitting blue light and the second pixel electrode 210B2 for emitting blue light. The first functional layer 221 may contact the second functional layer 223 on portions of the pixel-defining layer in other regions.

Referring to FIG. 11, the first red sub-pixel SP-R1, the first green sub-pixel SP-G1, the second red sub-pixel SP-R2, and the second green sub-pixel SP-G2 are apart from each other in the x-direction. The first red emission layer 222R1 of the first red sub-pixel SP-R1 may be spaced apart from the second red emission layer 222R2 of the second red sub-pixel SP-R2. Also, the first green emission layer 222G1 of the first green sub-pixel SP-G1 may be spaced apart from the second green emission layer 222G2 of the second green sub-pixel SP-G2. For example, the rest of the emission layers, for example, the first and second red emission layer 222R1 and 222R2, and the first and second green emission layers 222G1 and 222G2 except the first blue emission layer 222B may be individually patterned to correspond to the respective sub-pixels, for example, the first and second red sub-pixels SP-R1 and SP-R2 and the first and second green sub-pixels SP-G1 and SP-G2.

Figure 12:
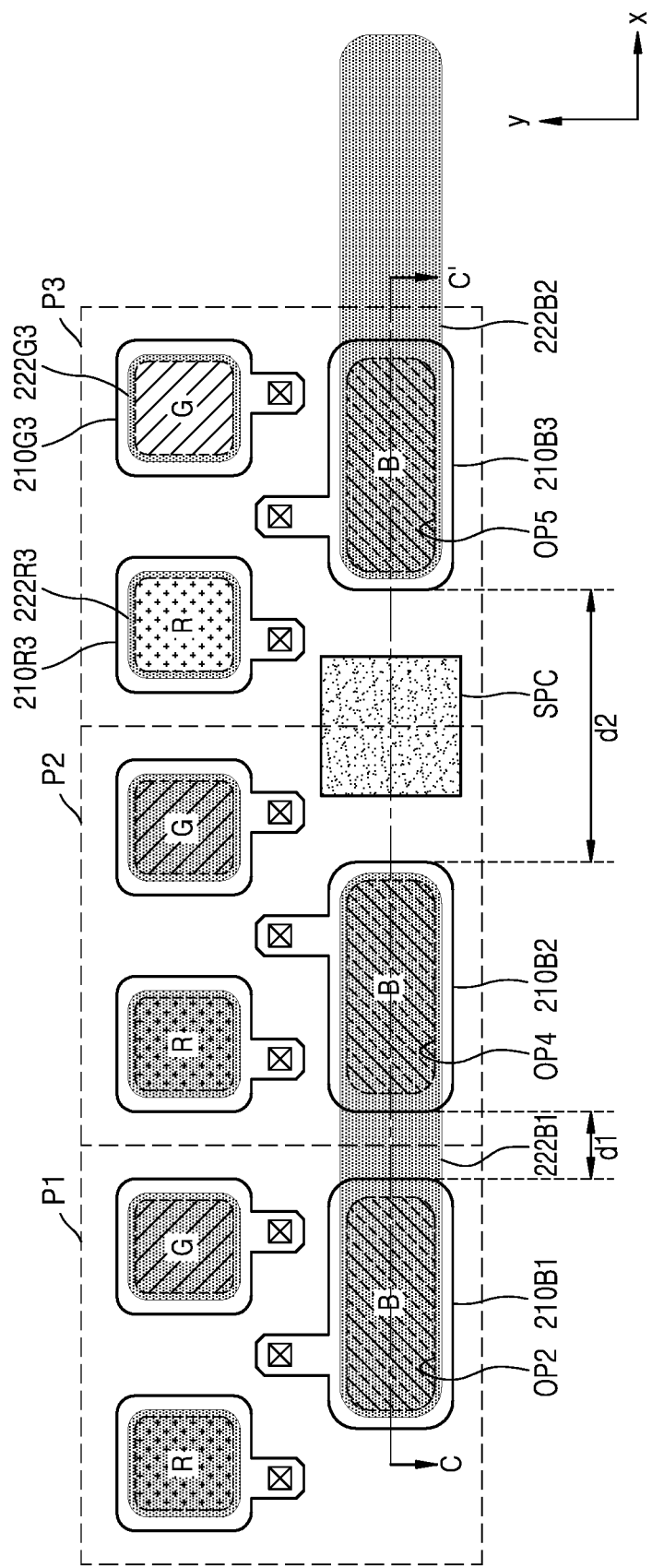
FIG. 12 is a plan view illustrating a portion of a display area of a display panel according to an exemplary embodiment of the present disclosure.
Figure 13:
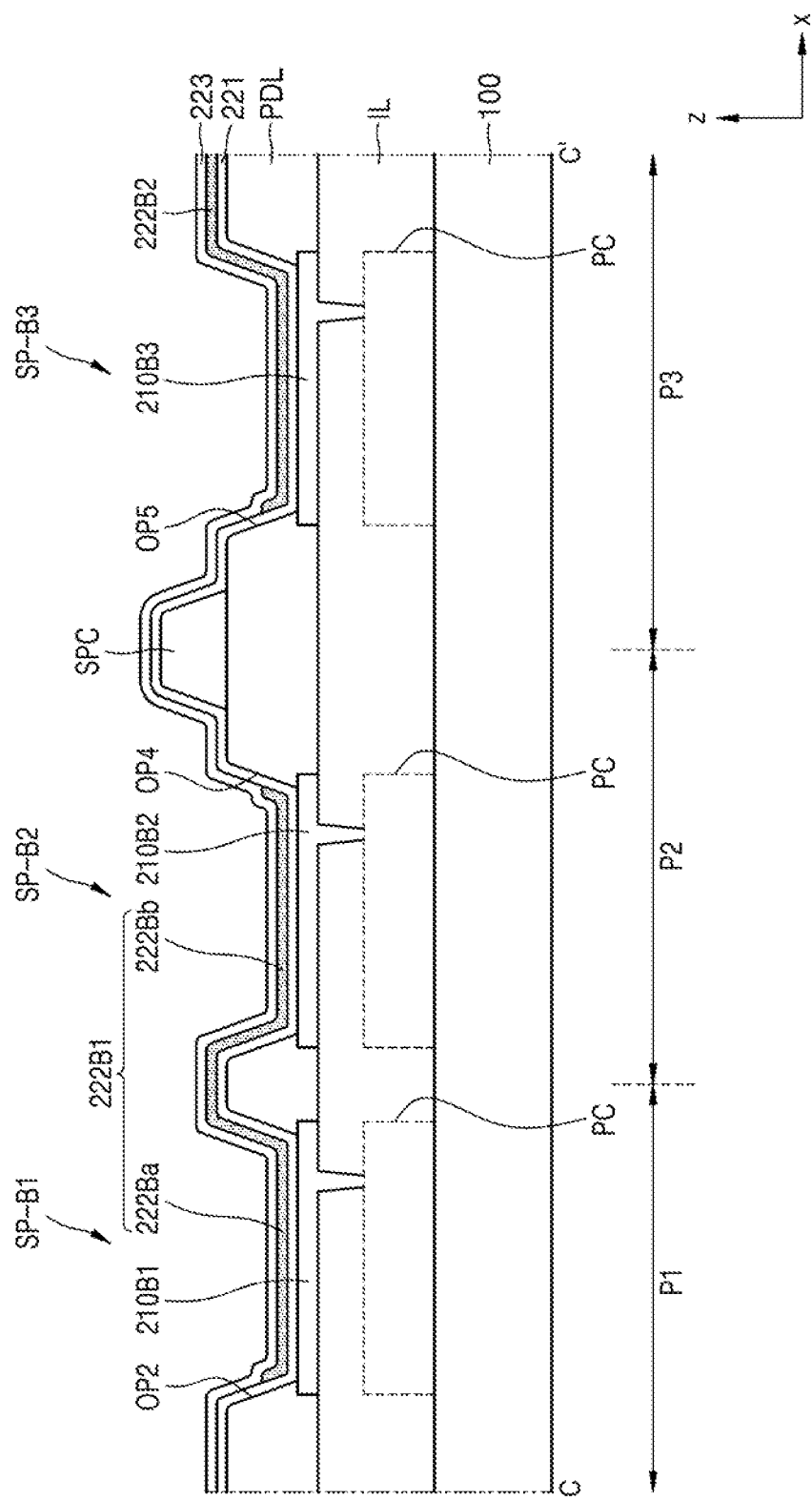
FIG. 13 is a cross-sectional view illustrating the display area taken along line C-C' of FIG. 12.

FIG. 12 is a plan view of a portion of a display area of a display panel according to an exemplary embodiment of the present disclosure, and FIG. 13 is a cross-sectional view of a portion of a display area of a display panel according to an exemplary embodiment of the present disclosure. FIG. 13 corresponds to a cross-sectional view of the display area taken along line C-C' of FIG. 12.

Referring to FIGS. 12 and 13, a third unit pixel P3 located on one side of the second unit pixel P2 is shown together. The first unit pixel P1, the second unit pixel P2, and the third unit pixel P3 neighbor each other in the x-direction. The first unit pixel P1 and the second unit pixel P2 shown in FIGS. 12 and 13 are the same as those shown in FIGS. 8 and 9.

The third unit pixel P3 may basically have the same structure as that of the first unit pixel P1. The third unit pixel P3 may include a third pixel electrode 210R3 for emitting red light, a third pixel electrode 210B3 for emitting blue light, and a third pixel electrode 210G3 for emitting green light. The third pixel electrode 210R3 for emitting red light and the third pixel electrode 210G3 for emitting green light are apart from each other in the x-direction, and the third pixel electrode 210B3 for emitting blue light is spaced apart from the third pixel electrode 210R3 for emitting red light or the third pixel electrode 210G3 for emitting green light in the y-direction. Referring to FIG. 12, the third pixel electrode 210B3 for emitting blue light of the third unit pixel P3 is spaced apart from the third pixel electrode 210G3 for emitting green light in the y-direction.

A third red emission layer 222R3 may be arranged on the third pixel electrode 210R3 for emitting red light, the second blue emission layer 222B2 may be arranged on the third pixel electrode 210B3 for emitting red light, and a third green emission layer 222G3 may be arranged on the third pixel electrode 210G3 for emitting green light. The second blue emission layer 222B2 may be provided over the third unit pixel P3 and a fourth unit pixel that neighbors the third unit pixel P3 in the x-direction. For example, a portion of the second blue emission layer 222B2 may correspond to the third pixel electrode 210B3 for emitting blue light of the third unit pixel P3, and another portion of the second blue emission layer 222B2 may correspond to the fourth pixel electrode for emitting blue light of the fourth unit pixel P4.

In the first unit pixel P1 to the third unit pixel P3, a distance d1 between the first pixel electrode 210B1 for emitting blue light and the second pixel electrode 210B2 for emitting blue light in the x-direction may be less than a distance d2 between the second pixel electrode 210B2 for emitting blue light and the third pixel electrode 210B3 for emitting blue light. Since the first pixel electrode 210B1 for emitting blue light and the second pixel electrode 210B2 for emitting blue light share the first blue emission layer 222B1, the first blue emission layer 222B1 may be relatively close to the second pixel electrode 210B2. Since the distance d2 between the second pixel electrode 210B2 for emitting blue light and the third pixel electrode 210B3 for emitting blue light is formed to be relatively large, an interval between open regions of a mask may be increased even more and thus a mask pattern may be easily manufactured.

The pixel-defining layer PDL may include the second opening OP2, a fourth opening OP4, and a fifth opening OP5, the second opening OP2 corresponding to the first pixel electrode 210B1 for emitting blue light, the fourth opening OP4 corresponding to the second pixel electrode 210B2 for emitting blue light, and the fifth opening OP5 corresponding to the third pixel electrode 210B3 for emitting blue light.

A spacer SPC may be arranged between the second pixel electrode 210B2 for emitting blue light and the third pixel electrode 210B3 for emitting blue light. Referring to FIG. 13, the spacer SPC may be arranged on a portion of the pixel-defining layer PDL that is located between the fourth opening OP4 and the fifth opening OP5. The spacer SPC may prevent a mask from sagging during a mask process of forming an emission layer. A top surface of the spacer SPC may contact a bottom surface of a mask and the mask may be supported by the spacer SPC. Therefore, the emission layer (e.g. the first blue emission layer 222B1 and the second blue emission layer 222B2) is not arranged on the spacer SPC. The first functional layer 221 may contact the second functional layer 223 on the top surface of the spacer SPC.

Figure 14:
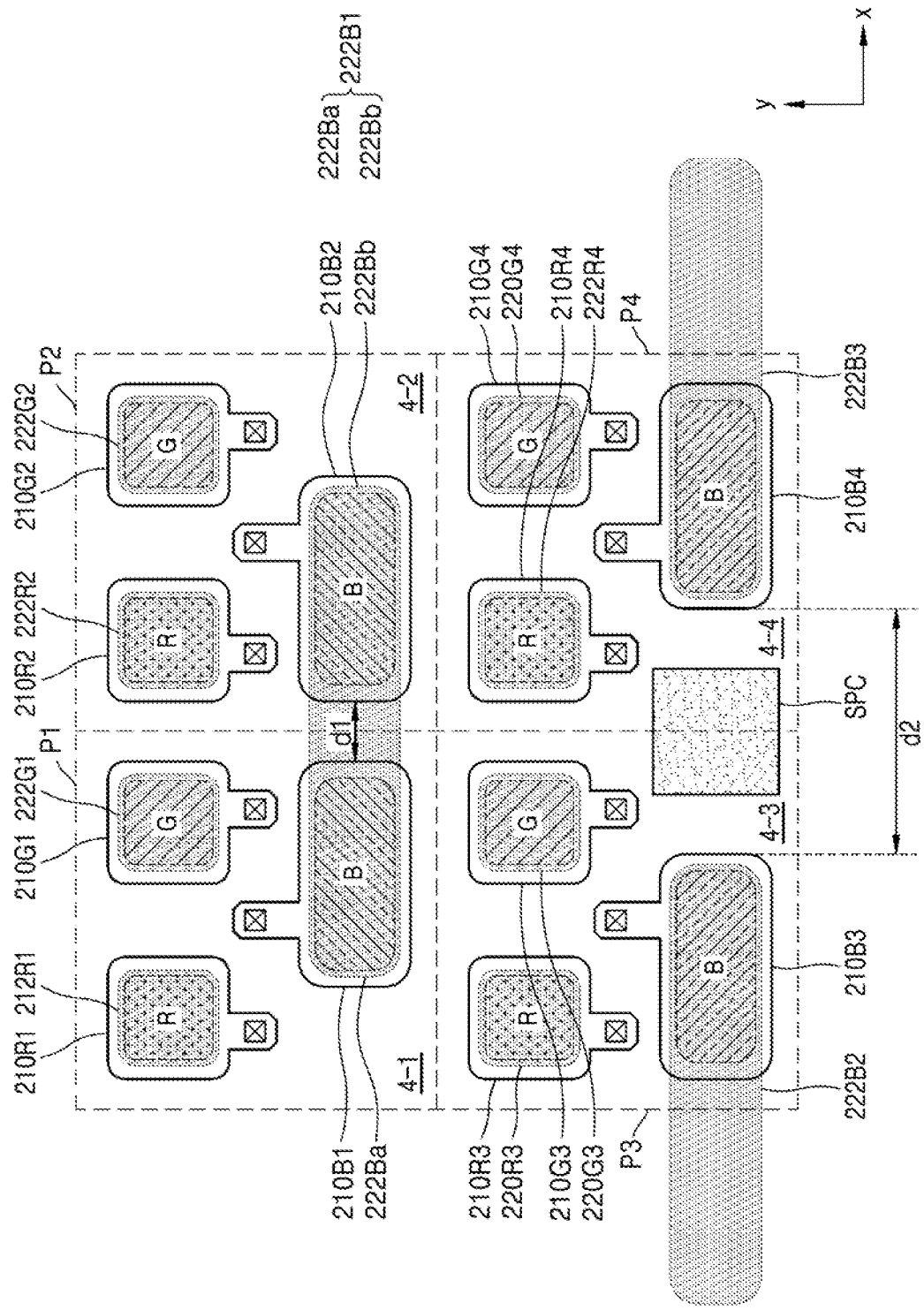
FIG. 14 is a plan view illustrating a portion of a display area of a display panel according to an exemplary embodiment of the present disclosure.

FIG. 14 is a plan view illustrating a portion of a display area of a display panel according to an exemplary embodiment of the present disclosure. FIG. 14 shows one pixel group PG.

Referring to FIG. 14, the pixel group PG may be arranged in a 2×2-matrix and may include a first unit pixel P1 arranged in a first quadrant 4-1, a second unit pixel P2 arranged in a second quadrant 4-2, a third unit pixel P3 arranged in a third quadrant 4-3, and a fourth unit pixel P4 arranged in a fourth quadrant 4-4. The pixel group PG may be repeatedly arranged in the x-direction (for example, a row direction) and the y-direction (for example, a column direction) in the display area DA of the display panel 10 according to an exemplary embodiment of the present disclosure.

In FIG. 14, the first unit pixel P1 arranged in the first quadrant 4-1 and the second unit pixel P2 arranged in the second quadrant 4-2 may have the same structure as that described with reference to FIGS. 8 and 9.

The third unit pixel P3 arranged in the third quadrant 4-3 may include the third pixel electrode 210R3 for emitting red light, the third pixel electrode 210B3 for emitting blue light, and the third pixel electrode 210G3 for emitting green light. The third red emission layer 222R3 may be arranged on the third pixel electrode 210R3 for emitting red light, the second blue emission layer 222B2 may be arranged on the third pixel electrode 210B3 for emitting blue light, and the third green emission layer 222G3 may be arranged on the third pixel electrode 210G3 for emitting green light. The second blue emission layer 222B2 may be arranged over the third unit pixel P3 and a unit pixel that neighbors the third unit pixel P3 in the x-direction. For example, a portion of the second blue emission layer 222B2 may correspond to the third pixel electrode 210B3 for emitting blue light of the third unit pixel P3, and another portion of the second blue emission layer 222B2 may correspond to a pixel electrode for emitting blue light of a unit pixel that neighbors one side (for example, the left side) of the third unit pixel P3.

The fourth unit pixel P4 arranged in the fourth quadrant 4-4 may include a fourth pixel electrode 210R4 for emitting red light, a fourth pixel electrode 210B4 for emitting blue light, and a fourth pixel electrode 210G4 for emitting green light. A fourth red emission layer 222R4 may be arranged on the fourth pixel electrode 210R4 for emitting red light, a third blue emission layer 222B3 may be arranged on the fourth pixel electrode 210B4 for emitting blue light, and a fourth green emission layer 222G4 may be arranged of the fourth pixel electrode 210G4 for emitting green light. The third blue emission layer 222B3 may be arranged over the fourth unit pixel P4 and a unit pixel that neighbors the fourth unit pixel P4 in the x-direction. For example, a portion of the third blue emission layer 222B3 may correspond to the fourth pixel electrode 210B4 for emitting blue light of the fourth unit pixel P4, and another portion of the third blue emission layer 222B3 may correspond to a pixel electrode for emitting blue light of a unit pixel that neighbors another side (for example, the right side) of the fourth unit pixel P4.

In the first unit pixel P1 to the fourth unit pixel P4 arranged in a 2×2-matrix, a distance d1 between the first pixel electrode 210B1 for emitting blue light and the second pixel electrode 210B2 for emitting blue light in the x-direction may be less than a distance d2 between the third pixel electrode 210B3 for emitting blue light and the fourth pixel electrode 210B4 for emitting blue light. Since the first pixel electrode 210B1 for emitting blue light and the second pixel electrode 210B2 for emitting blue light share the first blue emission layer 222B1, the first pixel electrode 210B1 may be relatively close to the second pixel electrode 210B2. Such an arrangement is equally applicable to the third unit pixel P3 and a unit pixel that neighbors to one side (for example, the left side) of the third unit pixel P3, and the fourth unit pixel P4 and a unit pixel that neighbors to another side (for example, the right side) of the fourth unit pixel P4.

Also, since the distance d2 between the third pixel electrode 210B3 for emitting blue light and the fourth pixel electrode 210B4 for emitting blue light is formed relatively large, an interval between open regions of a mask may be further increased and thus a mask pattern may be easily manufactured.

A spacer SPC may be arranged between the third pixel electrode 210B3 for emitting blue light and the fourth pixel electrode 210B4 for emitting blue light. The spacer SPC may be arranged on a portion of the pixel-defining layer PDL that is located between an opening corresponding to the third pixel electrode 210B3 for emitting blue light and an opening corresponding to the fourth pixel electrode 210B4 for emitting blue light.

Figure 15:
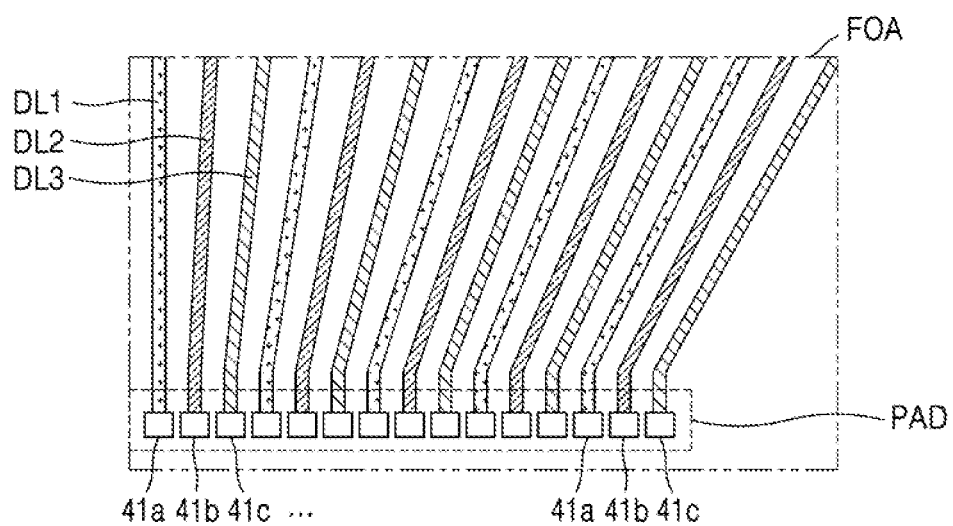
FIGS. 15 and 16 are plan views illustrating a portion of a fan-out area of a display panel according to an exemplary embodiment of the present disclosure.
Figure 16:
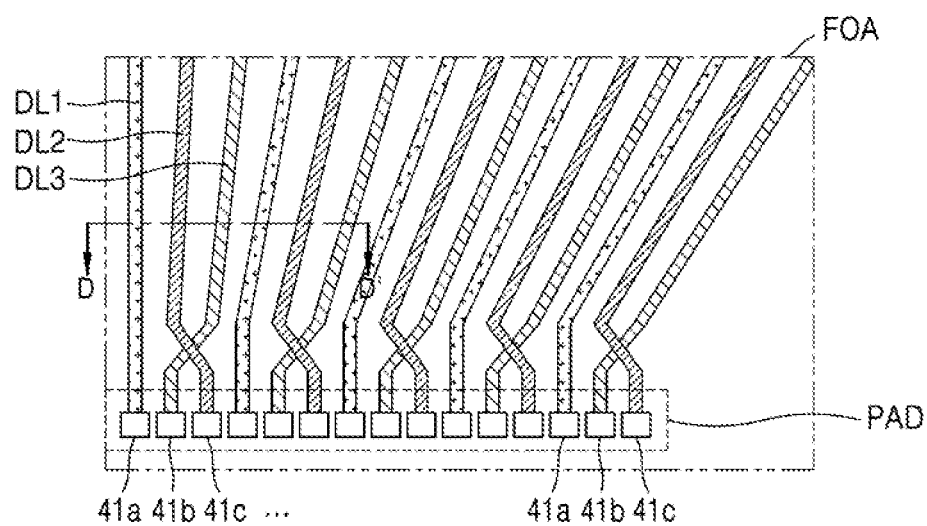
Figure 17:
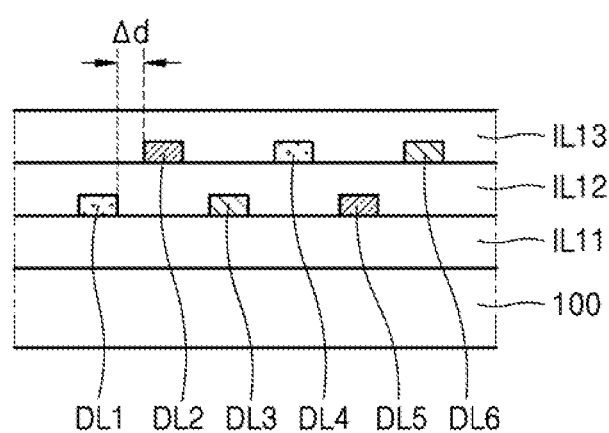
FIG. 17 is a cross-sectional view of the fan-out area taken along line D-D' of FIG. 16.

FIGS. 15 and 16 are plan views illustrating a portion of a fan-out area FOA of a display panel according to an exemplary embodiment of the present disclosure, and FIG. 17 is a cross-sectional view of the fan-out area FOA taken along line D-D' of FIG. 16.

FIGS. 15 and 16 show the fan-out area FOA located in the non-display area NDA. Referring to FIG. 2 together, a plurality of data lines DL may extend primarily in the y-direction in the display area DA. The plurality of data lines DL have a structure concentrated toward pads arranged in the non-display area NDA.

In the fan-out area FOA, the plurality of data lines DL may extend primarily in the y-direction and include a first data line DL1, a second data line DL2, and a third data line DL3 that are apart from each other and sequentially arranged in the x-direction. One sides of the first data line DL1, the second data line DL2, and the third data line DL3 may be respectively connected to first to third pads 41a, 41b, and 41c located in a pad unit PAD. The first data line DL1, the second data line DL2, and the third data line DL3 may receive a data signal from a data driver through the first to third pads 41a, 41b, and 41c, the data signal being supplied to each unit pixel P.

Referring to FIGS. 8 and 15, the first data line DL1 may supply a data signal to the first red sub-pixel SP-R1, the second data line DL2 may supply a data signal to the first blue sub-pixel SP-B1, and the third data line DL3 may supply a data signal to the first green sub-pixel SP-G1.

Referring to FIG. 16, the second data line DL2 and the third data line DL3 may intersect and overlap each other in a plan view. Therefore, one side of the second data line DL2 may be connected to the third pad 41c, and one side of the third data line DL3 may be connected to the second pad 41b.

As shown in FIG. 17, the plurality of data lines DL may be alternately arranged on different layers. According to an exemplary embodiment of the present disclosure, the first data line DL1, the third data line DL3, and a fifth data line DL5 may be arranged on a first insulating layer IL11, and the second data line DL2, the fourth data line DL4, and the sixth data line DL6 may be arranged on a second insulating layer IL12 at least partially covering the first data line DL1, the third data line DL3, and the fifth data line DL5. The second data line DL2, the fourth data line DL4, and the sixth data line DL6 may be at least partially covered by a third insulating layer IL13. As described above, since the plurality of data lines DL are alternately arranged on different layers, a pitch Δd between the plurality of data lines DL may be reduced.

According to an exemplary embodiment of the present disclosure, the first data line DL1, the third data line DL3, and the fifth data line DL5 may include the same material as that of the gate electrode (e.g. the driving gate electrode G1) described with reference to FIG. 6. The second data line DL2, the fourth data line DL4, and the sixth data line DL6 may include the same material as that of the second storage capacitor plate Cst2 of the storage capacitor Cst described with reference to FIG. 6. In this case, the first insulating layer IL11 may correspond to the gate insulating layer IL2, the second insulating layer IL12 may correspond to the first interlayer insulating layer IL3, and the third insulating layer IL13 may correspond to the second interlayer insulating layer IL4. However, the present invention is not limited thereto and the data lines may be formed by using the conductive layers and the insulating layers shown in FIG. 6 or 7.

Figure 18:
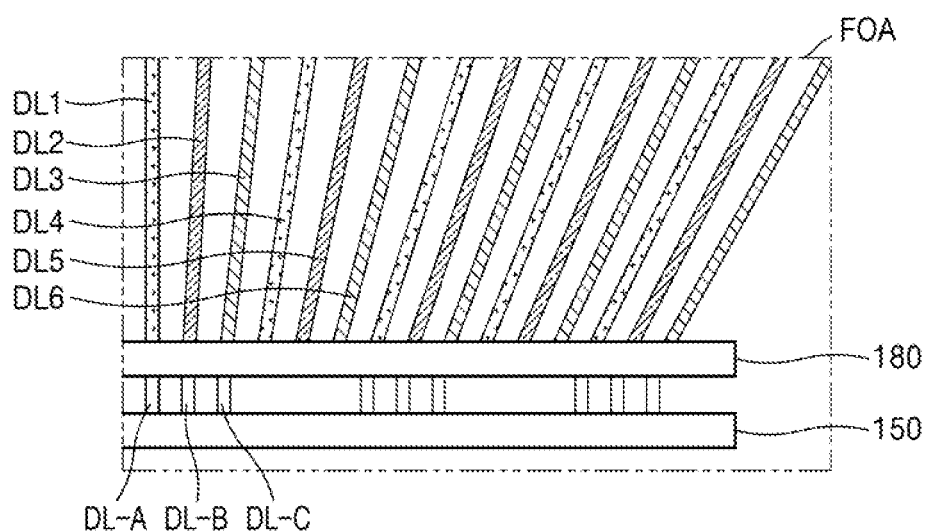
FIG. 18 is a plan view illustrating a portion of a fan-out area of a display panel according to an exemplary embodiment of the present disclosure.

FIG. 18 is a plan view illustrating a portion of the fan-out area FOA of a display panel according to an exemplary embodiment of the present disclosure.

FIG. 18 shows the data driving circuit 150 and a data divider 180 in the non-display area NDA, the data divider 180 including demultiplexers electrically connected to the plurality of data lines DL.

The data divider 180 may be connected to a plurality of output lines DL-A, DL-B, and DL-C and connected to the plurality of data lines DL, for example, the first to sixth data lines DL1, DL2, DL3, DL4, DL5, and DL6. The data divider 180 may include m/i demultiplexers (where i is a natural number equal to or greater than 2) including a plurality of switching devices. A demultiplexer supplies a data signal to i data lines, the data signal being supplied from one output line. Therefore, in the case where the demultiplexer is used, since output lines of the data driving circuit 150 need not be formed as many as the number of data lines, the number of output lines connected to the data driving circuit 150 may be reduced, and thus the number of integrated circuits included in the data driving circuit 150 may be reduced.

In the fan-out area FOA, the plurality of data lines DL may include the first to sixth data lines DL1, DL2, DL3, DL4, DL5, and DL6 extending primarily in the y-direction and being spaced apart from each other and sequentially arranged in the x-direction. Referring to FIG. 8, the first data line DL1 may supply a data signal to the first red sub-pixel SP-R1, the second data line DL2 may supply a data signal to the first blue sub-pixel SP-B1, and the third data line DL3 may supply a data signal to the first green sub-pixel SP-G1. Also, the fourth data line DL4 may supply a data signal to the second red sub-pixel SP-R2, the fifth data line DL5 may supply a data signal to the second blue sub-pixel SP-B2, and the sixth data line DL6 may supply a data signal to the second green sub-pixel SP-G2.

Though the display panel has been mainly described up to now, the present invention is not limited thereto. For example, a display device including the display panel also belongs to the scope of the present disclosure.

According to an exemplary embodiment of the present disclosure described above, the display panel that is easily manufactured and has increased emission uniformity may be provided. However, the scope of the present invention is not limited by this effect.

It should be understood that embodiments described herein should be considered in a descriptive sense and may be variously changed within the scope of the present disclosure. Descriptions of features or aspects within each embodiment should typically be considered as available for other similar features or aspects in other embodiments. While one or more exemplary embodiments of the present disclosure have been described with reference to the figures, it will be understood by those of ordinary skill in the art that various changes in form and details may be made therein without departing from the spirit and scope of the present disclosure.

What is claimed is:

1. A display panel comprising a plurality of pixel groups disposed in a display area of a substrate,
   wherein each of the plurality of pixel groups is arranged in a 2×2-matrix and includes a first unit pixel disposed in a first quadrant of the matrix, a second unit pixel disposed in a second quadrant of the matrix, a third unit pixel disposed in a third quadrant of the matrix, and a fourth unit pixel disposed in a fourth quadrant of the matrix,
   wherein the first unit pixel includes a first red pixel electrode for emitting red light, a first blue pixel electrode for emitting blue light, and a first green pixel electrode for emitting green light, the second unit pixel includes a second red pixel electrode for emitting red light, a second blue pixel electrode for emitting blue light, and a second green pixel electrode for emitting green light, the third unit pixel includes a third red pixel electrode for emitting red light, a third blue pixel electrode for emitting blue light, and a third green pixel electrode for emitting green light, and the fourth unit pixel includes a fourth red pixel electrode for emitting red light, a fourth blue pixel electrode for emitting blue light, and a fourth green pixel electrode for emitting green light,
   wherein a distance between the first red pixel electrode and the second red pixel electrode, in a row direction, is the same as a distance between the third red pixel electrode and the fourth red pixel electrode,
   wherein a distance between the first blue pixel electrode and the second blue pixel electrode, in the row direction, is less than a distance between the third blue pixel electrode and the fourth blue pixel electrode,
   wherein the first unit pixel and the second unit pixel each further include: a first blue emission layer disposed over both the first blue pixel electrode and the second blue pixel electrode,
   wherein a first portion of the first blue emission layer corresponds to the first blue pixel electrode, and a second portion of the first blue emission layer corresponds to the second blue pixel electrode,
   wherein the display panel further comprises a pixel-defining layer including a first opening and a second opening, the first opening defining an emission area of the first blue pixel electrode, and the second opening defining an emission area of the second blue pixel electrode, and
   wherein at least a portion of the first blue emission layer is disposed on a portion of the pixel-defining layer that is between the first blue pixel electrode and the second blue pixel electrode.

2. A display panel comprising a plurality of pixel groups disposed in a display area of a substrate,
   wherein each of the plurality of pixel groups is arranged in a 2×2-matrix and includes a first unit pixel disposed in a first quadrant of the matrix, a second unit pixel disposed in a second quadrant of the matrix, a third unit pixel disposed in a third quadrant of the matrix, and a fourth unit pixel disposed in a fourth quadrant of the matrix,
   wherein the first unit pixel includes a first red pixel electrode for emitting red light, a first blue pixel electrode for emitting blue light, and a first green pixel electrode for emitting green light, the second unit pixel includes a second red pixel electrode for emitting red light, a second blue pixel electrode for emitting blue light, and a second green pixel electrode for emitting green light, the third unit pixel includes a third red pixel electrode for emitting red light, a third blue pixel electrode for emitting blue light, and a third green pixel electrode for emitting green light, and the fourth unit pixel includes a fourth red pixel electrode for emitting red light, a fourth blue pixel electrode for emitting blue light, and a fourth green pixel electrode for emitting green light,
   wherein a distance between the first red pixel electrode and the second red pixel electrode, in a row direction, is the same as a distance between the third red pixel electrode and the fourth red pixel electrode,
   wherein a distance between the first blue pixel electrode and the second blue pixel electrode, in the row direction, is less than a distance between the third blue pixel electrode and the fourth blue pixel electrode, wherein the first unit pixel and the second unit pixel each further include: a first blue emission layer disposed over both the first blue pixel electrode and the second blue pixel electrode, wherein a first portion of the first blue emission layer corresponds to the first blue pixel electrode, and a second portion of the first blue emission layer corresponds to the second blue pixel electrode, wherein the third unit pixel further includes a third blue emission layer disposed on the third blue pixel electrode, wherein the fourth unit pixel further includes a fourth blue emission layer disposed on the fourth blue pixel electrode, and wherein the third blue emission layer is spaced apart from the fourth blue emission layer.

3. The display device of claim 2, further comprising:

a pixel-defining layer including a third opening and a fourth opening, the third opening defining an emission area of the third blue pixel electrode, and the fourth opening defining an emission area of the fourth blue pixel electrode; and a spacer disposed on a portion of the pixel-defining layer that is between the third opening and the fourth opening.

\* \* \* \* \*